United States Patent
Wang et al.

(10) Patent No.: US 9,484,303 B2
(45) Date of Patent: Nov. 1, 2016

(54) STRESS TUNING FOR REDUCING WAFER WARPAGE

(71) Applicant: Taiwan Semiconductor Manufacturing Company, Ltd., Hsin-Chu (TW)

(72) Inventors: Yung-Yao Wang, Tainan (TW); Ying-Han Chiou, Tainan (TW); Ling-Sung Wang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 381 days.

(21) Appl. No.: 13/946,728

(22) Filed: Jul. 19, 2013

(65) Prior Publication Data

US 2014/0264931 A1    Sep. 18, 2014

Related U.S. Application Data

(60) Provisional application No. 61/780,825, filed on Mar. 13, 2013.

(51) Int. Cl.
| | |
|---|---|
| *H01L 29/00* | (2006.01) |
| *H01L 23/532* | (2006.01) |
| *H01L 21/768* | (2006.01) |
| *H01L 23/522* | (2006.01) |
| *H01L 23/00* | (2006.01) |

(52) U.S. Cl.
CPC ... *H01L 23/53295* (2013.01); *H01L 21/76801* (2013.01); *H01L 21/76829* (2013.01); *H01L 23/522* (2013.01); *H01L 23/5226* (2013.01); *H01L 24/05* (2013.01); *H01L 24/13* (2013.01); *H01L 2224/0401* (2013.01); *H01L 2224/05147* (2013.01); *H01L 2224/05166* (2013.01); *H01L 2224/05624* (2013.01); *H01L 2224/13101* (2013.01); *H01L 2224/13147* (2013.01); *H01L 2924/13091* (2013.01)

(58) Field of Classification Search
CPC ........... H01L 21/76843; H01L 21/768; H01L 21/76829
See application file for complete search history.

(56) References Cited

U.S. PATENT DOCUMENTS 5,994,762 A * 11/1999 Suwanai ............. H01L 23/3171
257/620

* cited by examiner

*Primary Examiner* — William Harriston
(74) *Attorney, Agent, or Firm* — Slater Matsil, LLP

(57) ABSTRACT

An integrated circuit structure includes a substrate, a plurality of low-k dielectric layers over the substrate, a first dielectric layer over the plurality of low-k dielectric layers, and a metal line in the first dielectric layer. A stress tuning dielectric layer is over the first dielectric layer, wherein the stress tuning dielectric layer includes a first opening and a second opening. The metal line extends into the first opening. The second opening has a bottom substantially level with a top surface of the first dielectric layer. A second dielectric layer is over the first dielectric layer.

20 Claims, 23 Drawing Sheets

STRESS TUNING FOR REDUCING WAFER WARPAGE

This application claims the benefit of U.S. Provisional Patent Application No. 61/780,825, filed Mar. 13, 2013, and entitled "Stress Tuning for Reducing Wafer Warpage," which application is incorporated herein by reference.

BACKGROUND

As is well known in the art, most integrated circuits are manufactured on wafers, typically semiconductor wafers, and more typically silicon wafers. Wafers have grown from a mere two inches in diameter to eight inches in diameter and, more recently, to twelve inches in diameter, also known as 300 mm wafers. While some devices manufactured today are manufactured on eight-inch wafers, most new integrated device manufacturing facilities will be designed to manufacture on twelve-inch wafers.

As the area of a circle is related to the square of its diameter, a fifty percent increase in the diameter (as in moving from an eight-inch wafer to a twelve-inch wafer) results in more than double the available surface area for manufacturing devices.

Another trend in integrated circuit device manufacturing relates to packaging technology. With the move toward surface mount technology and so called low profile packages, wafers are being ground to increasingly lesser thicknesses as part of the packaging process.

As wafers become larger in diameter and thinner in thickness, previously unknown or at least unappreciated forces play an increasingly important role. These forces include the compressive or tensile stress applied to the wafer, and to the chips in the wafer, by the thin films that are formed thereon as part of the integrated circuit manufacturing processes.

The combination of a greater number of thin films applying stress to thinner wafers/chips results in significant warpage of the wafer/chip and of the subsequently formed integrated circuits. As is known, the wafers are diced into individual chips that, when packaged, form complete integrated circuit devices.

The warpage has several detrimental effects. One of the detrimental effects is that the warpage of chips or wafers can significantly impact the electrical performance of the devices formed in the chips/wafers. As is known, the stress in the semiconductor layer on which MOS transistors are formed can significantly impact charge carrier mobility. The stress caused by the warpage of chips/wafers can adversely impact the charge carrier mobility. In addition, the warpage of chips/wafers causes cold joints in the packaging processes, and may the reduction in yield.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A wafer and the method of forming the same are provided in accordance with various exemplary embodiments. The intermediate stages of forming the wafer are illustrated. The variations of the embodiments are discussed. Throughout the various views and illustrative embodiments, like reference numbers are used to designate like elements.

Figure 1:
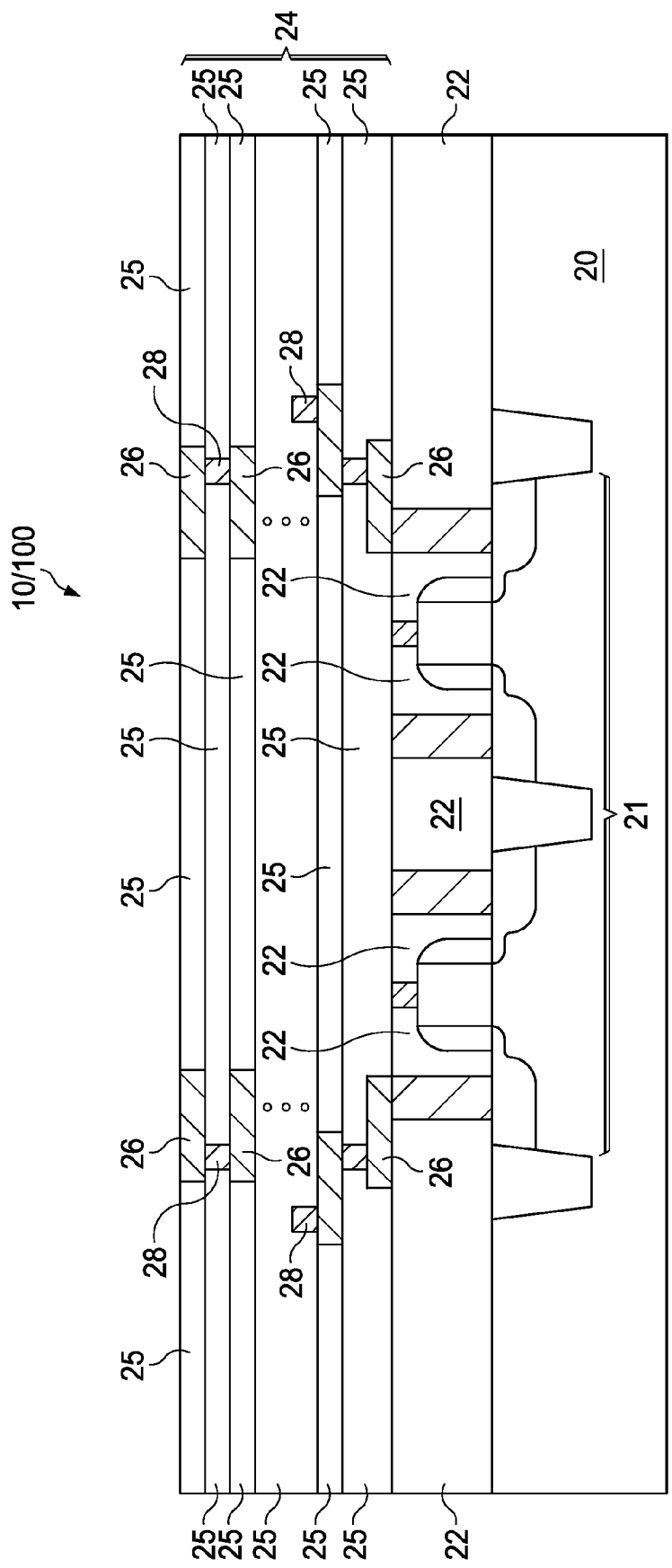
FIGS. 1 through 9 are cross-sectional views of intermediate stages in the manufacturing of a wafer in accordance with some exemplary embodiments, wherein the wafer comprises stress tuning layers.

Referring to FIG. 1, chip 10 is illustrated. Chip 10 is a portion of wafer 100 that includes a plurality of chips. As shown in FIG. 1, wafer 100 includes semiconductor substrate 20, which may be a bulk silicon substrate or a silicon-on-insulator substrate. Alternatively, other semiconductor materials that include group III, group IV, and/or group V elements may also be comprised in substrate 20, which semiconductor materials may include silicon germanium, silicon carbon, and/or III-V compound semiconductor materials. Integrated circuits, which are schematically represented by transistors 21, may be formed at a surface of semiconductor substrate 20.

Chip 10 may further include Inter-Layer Dielectric (ILD) 22 over semiconductor substrate 20, and interconnect structure 24 over ILD 22. Interconnect structure 24 includes metal lines 26 and vias 28, which are formed in dielectric layers 25. The metal lines 26 at a same level are collectively referred to as a metal layer hereinafter. In some embodiments, interconnect structure 24 includes a plurality of metal layers that are interconnected through vias 28. Metal lines 26 and vias 28 may be formed of copper or copper alloys, although they can also be formed of other metals. In some embodiments, dielectric layers 25 include low-k dielectric layers formed of low-k dielectric materials. The dielectric constants (k values) of the low-k dielectric materials may be smaller than about 3.0, or smaller than about 2.5, for example.

Figure 2:
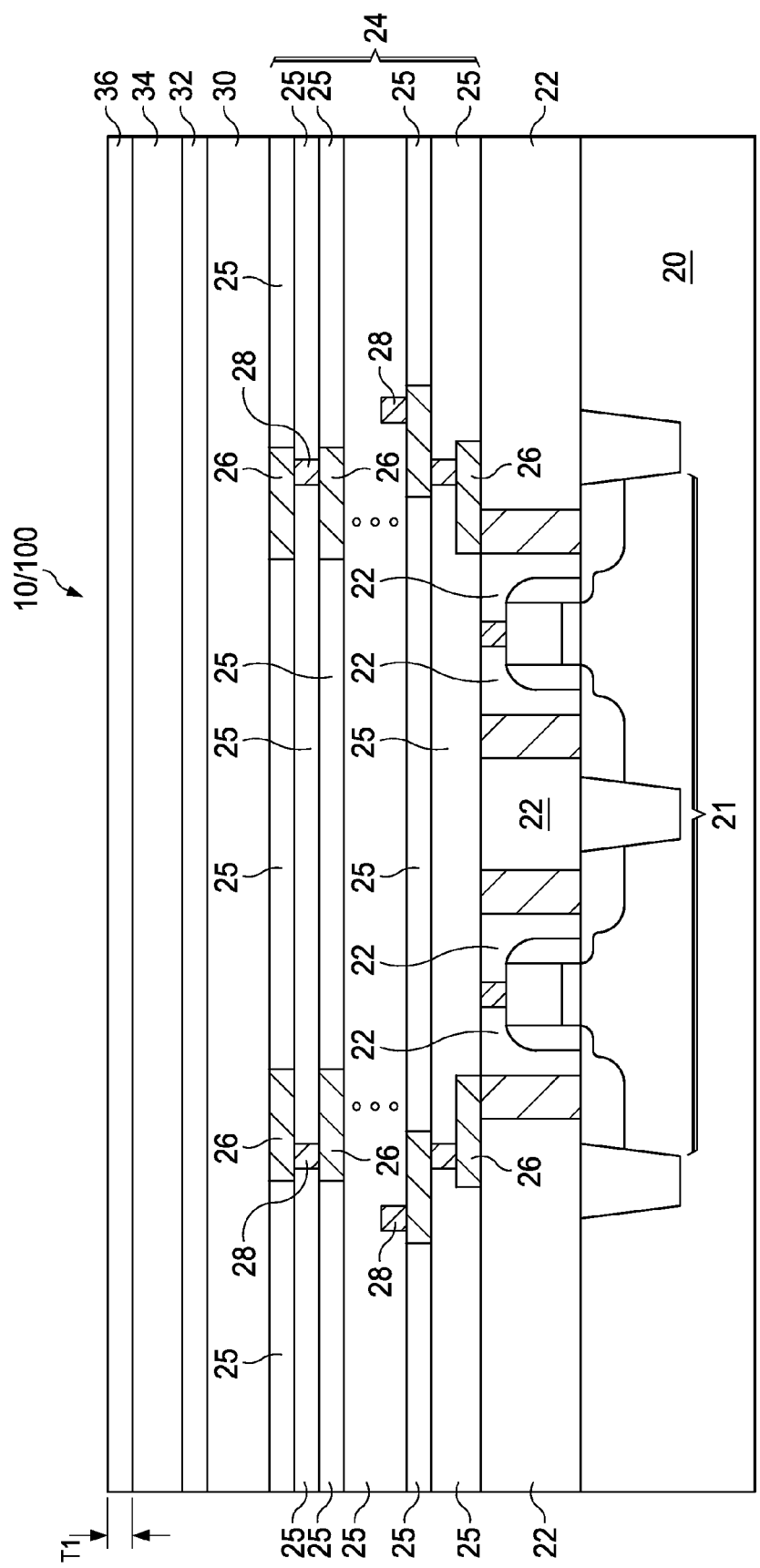

Referring to FIG. 2, a plurality of layers is formed. The plurality of layers includes dielectric layer 30, etch stop layer 32 over dielectric layer 30, dielectric layer 34 over dielectric layer 32, and stress tuning layer 36 over dielectric layer 34. In some embodiments, dielectric layers 30 and 34 are formed of Un-doped Silicate Glass (USG). In alternative embodiments, dielectric layers 30 and 34 are formed of other dielectric materials such as Fluorosilicate Glass (FSG), Boro-Phospho-Silicate-Glass (BPSG), Phosphosilicate Glass (PSG), or the like. Etch stop layer 32 is formed of a material that has a high etching selectivity with relative to dielectric layer 34, and may comprise silicon nitride, silicon carbide, silicon oxynitride, or the like. Furthermore, dielectric layers 30 and 34 may be low-k dielectric layers having dielectric constants (k values) greater than 3.8, or may have k values equal to or lower than 3.8. The formation of layers 30, 32, 34, and 36 may include Plasma Enhanced Chemical Vapor Deposition (PECVD), Atomic Layer Deposition (ALD), and the like.

Stress tuning layer 36 is formed over, and may be in contact with, dielectric layer 34. Stress tuning layer 36 may comprise silicon nitride, silicon oxide, Un-doped Silicate Glass (USG), or the like. Stress tuning layer 36 may have an internal stress, which may have a magnitude greater than about 4 MPa. Thickness T1 of stress tuning layer 36 may be greater than about 100 Å, and may be greater than about 200 Å.

Figure 23:
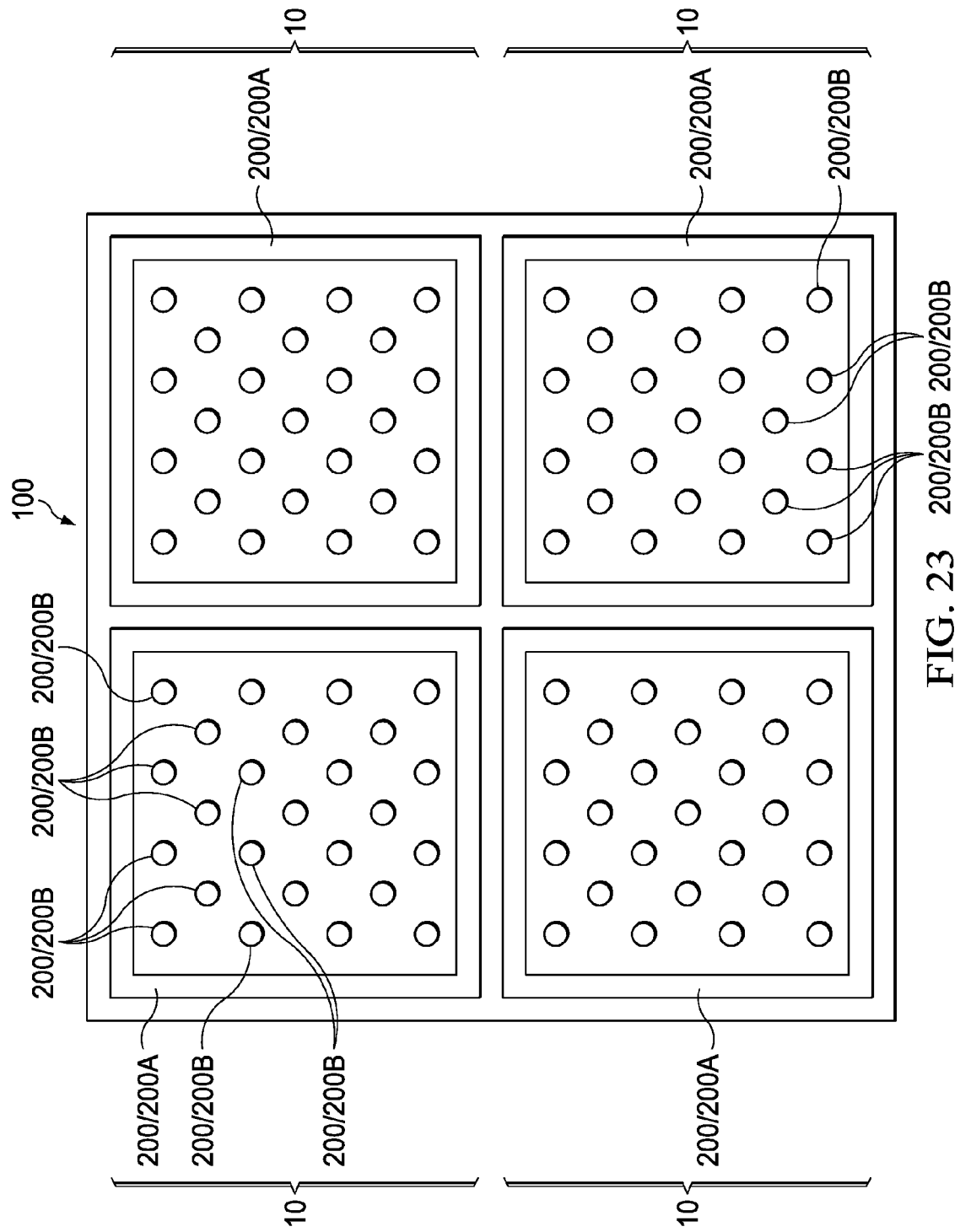
FIG. 23 illustrates a top view of a portion of a wafer in accordance with some exemplary embodiments, with the stress tuning regions distributed in the wafer.

After the structure in FIG. 2 is formed, the stress distribution and the warpage of wafer 100 are measured and recorded. In accordance with the measured stress distribution and the warpage of wafer 100, locations for forming stress tuning structures are calculated. The stress tuning structures are used to compensate for the stress in wafer 100, and it is desirable that after the subsequent stress tuning steps are performed, and/or the stress tuning structures are formed, the stress in wafer 100 is released and alleviated, and the wafer warpage is reduced or substantially eliminated. FIG. 23 schematically illustrates stress tuning structures 200 that are distributed in wafer 100. In some embodiments, stress tuning structures 200 include one or both of stress tuning rings 200A and stress tuning islands 200B. In some embodiments, stress tuning ring 200A is formed adjacent to the peripheral of chips 10, and may have four edges close to the four edges of the respective chips 10. Stress tuning islands 200B may be distributed throughout chips 10, and may be isolated from each other. Stress tuning islands 200B may have any of a plurality of top-view shapes including and not limited to, rectangles, circles, elongated strips, hexagons, octagons, or other irregular shapes.

Figure 3:
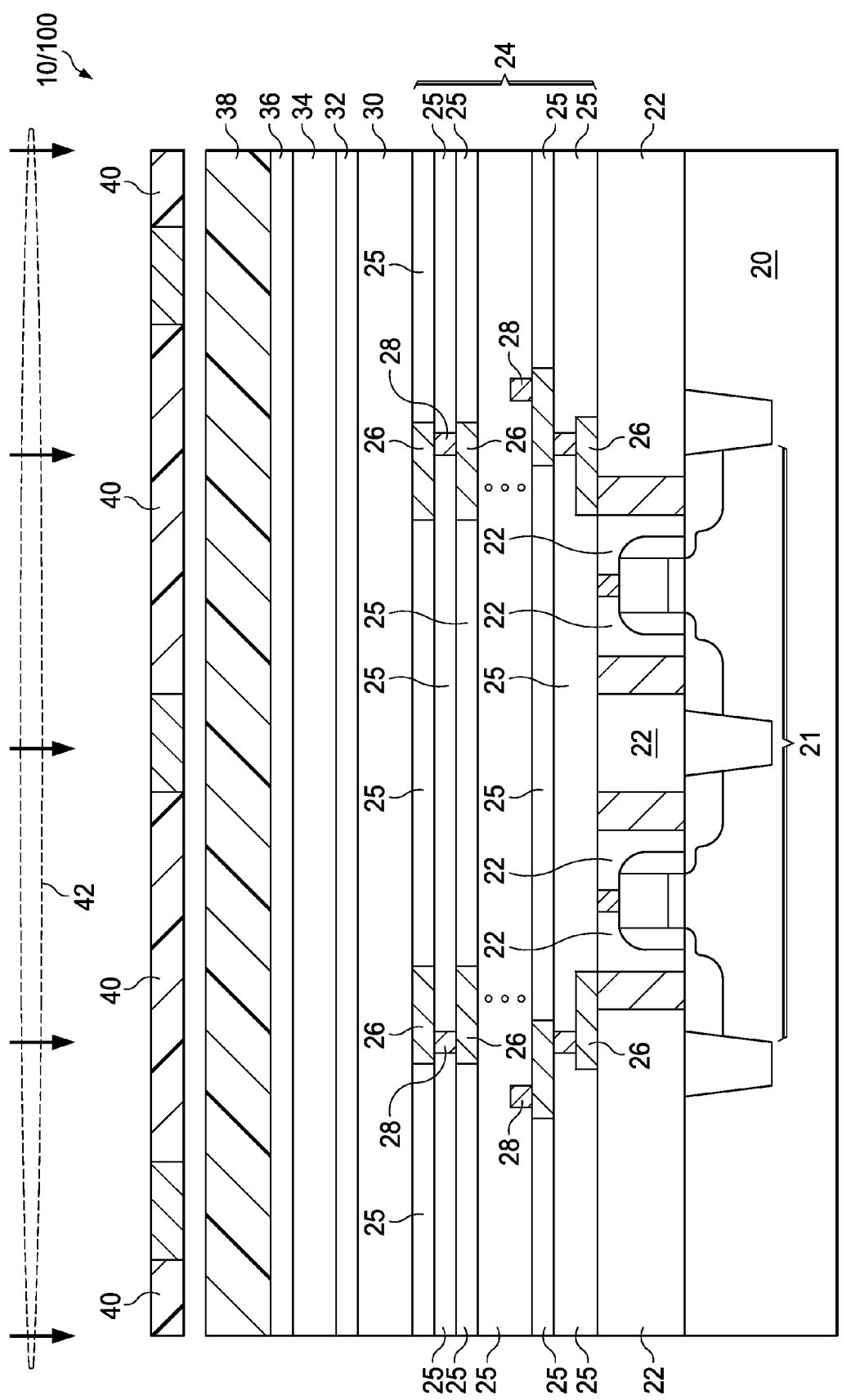

Next, as shown in FIG. 3, photo resist 38 is applied on wafer 100. Lithography mask 40 is then used to expose photo resist 38, wherein lithography mask 40 includes opaque portions for blocking light 42 and transparent portions allowing light 42 to pass through. The patterns of lithography mask 40 correspond to the patterns of stress tuning structures 200 in FIG. 23. The exposed photo resist 38 is then developed, and some portions (such as the exposed portions) are removed, while other portions (such as the unexposed portions) remain.

Figure 4:
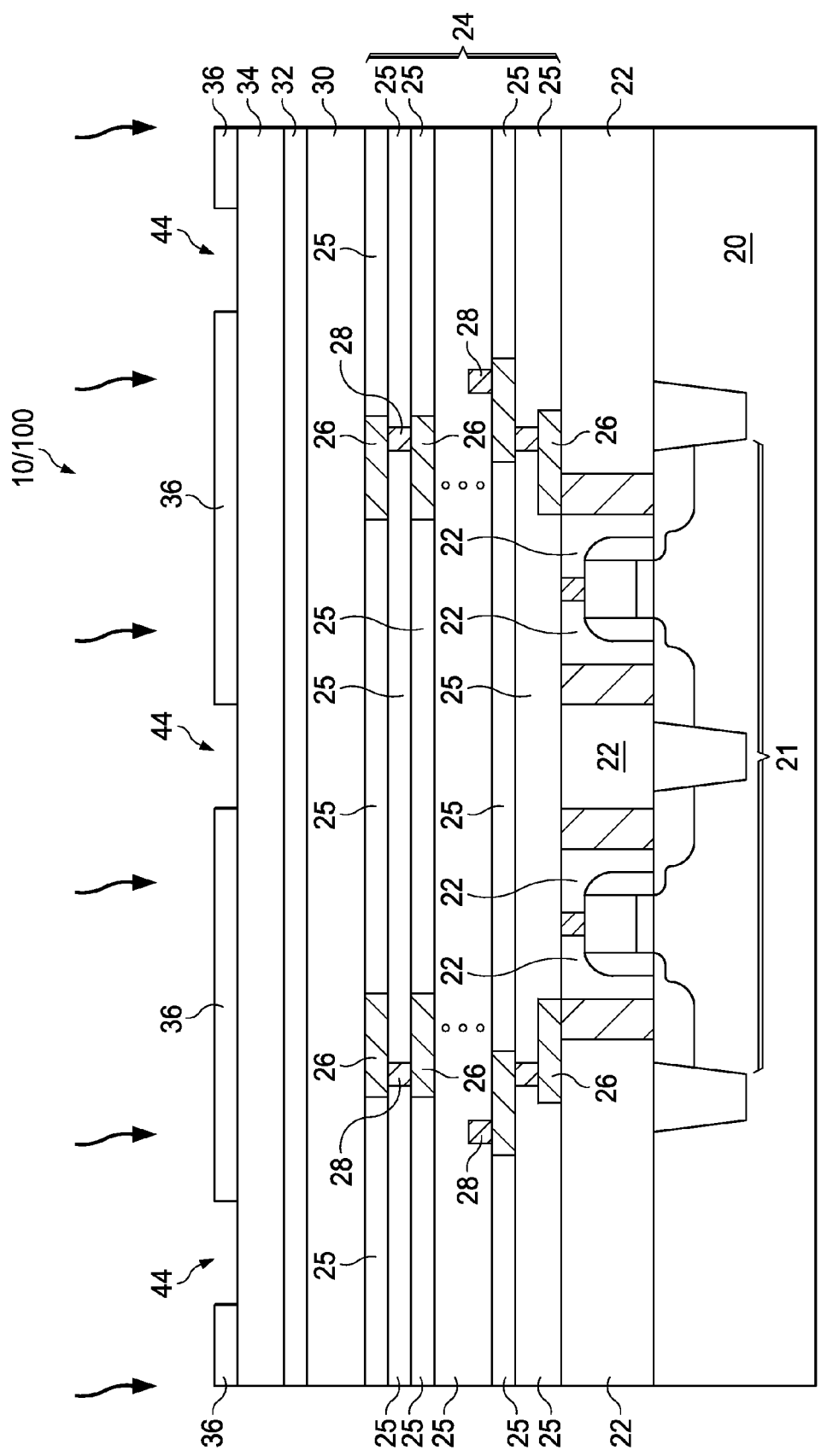

The developed photo resist 38 is then used as an etching mask to etch the underlying stress tuning layer 36, followed by the removal of photo resist 38. The resulting structure is shown in FIG. 4. Openings 44 are formed in stress tuning layer 36 as the result of etching. In these embodiments, openings 44 act as the stress tuning structures 200 in FIG. 23, and hence may have the same patterns (such as the same top view shapes), and are in the same locations as, stress tuning structures 200 in FIG. 23. In some embodiments, stress tuning layer 36 are removed in subsequent steps, and an annealing may be performed to transfer the stress in stress tuning layer 36 to the underlying dielectric layers 34, 32, and 30 in order to compensate for the stress in wafer 100. Accordingly, the warpage of wafer 100 may be reduced. In some embodiments, the annealing is performed at a temperature between about 100° C. and about 500° C. The annealing may last for a period of time between about 30 seconds and about 10 minutes. In alternative embodiments, the annealing is not performed.

Figure 5:
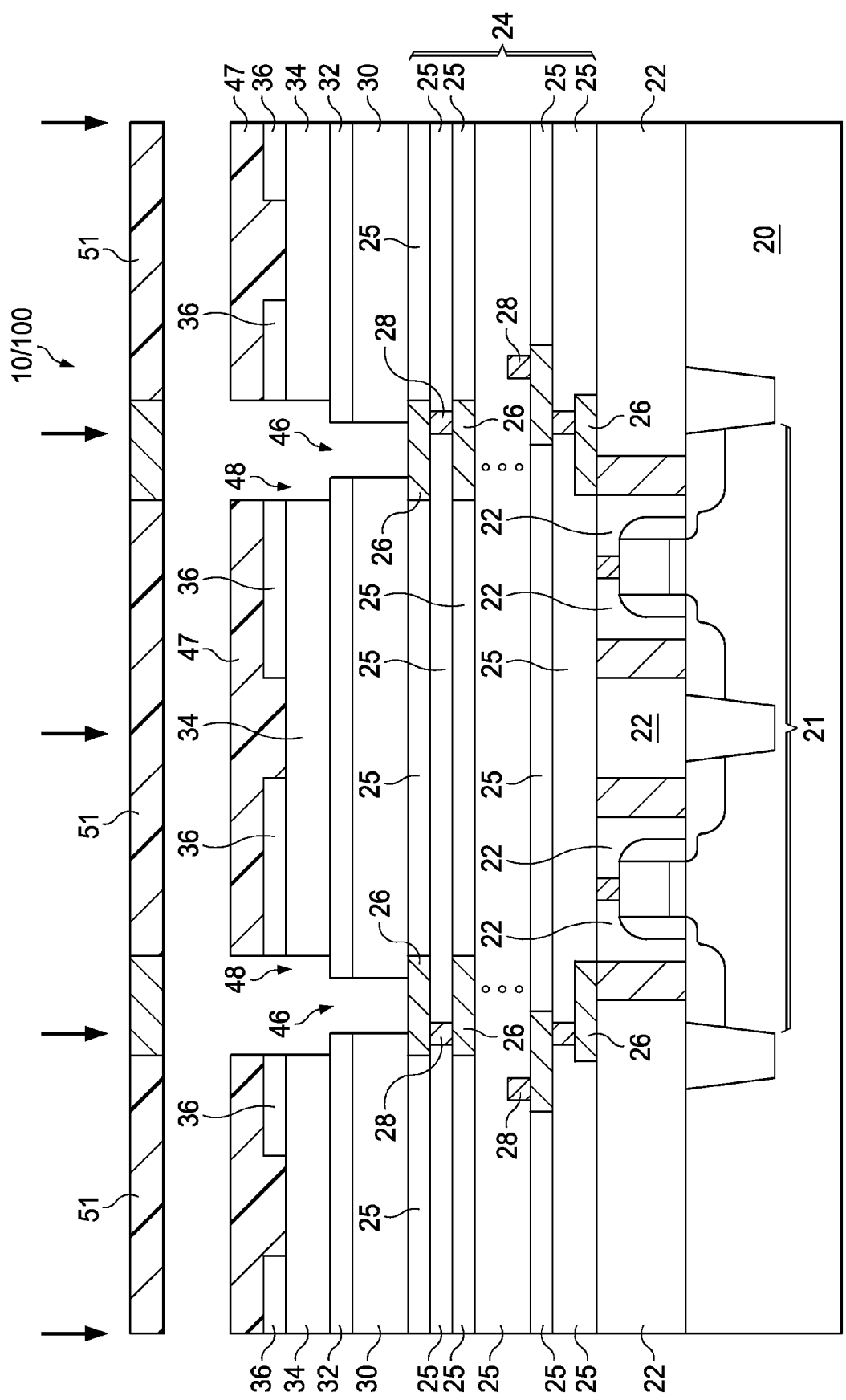

Referring to FIG. 5, trenches 48 and via openings 46 are formed in dielectric layers 34 and 30, respectively. Photo resist 47 and lithography mask 51 are used in the formation of trenches 48 and via openings 46. Etch stop layer 32 is used to stop the etching for forming trenches 48. Metal lines 26 are exposed through trenches 48 and via openings 46. The positions of trenches 48 and via openings 46 are misaligned with openings 44. After the formation of trenches 48 and via openings 46, photo resist 47 is removed.

Figure 6:
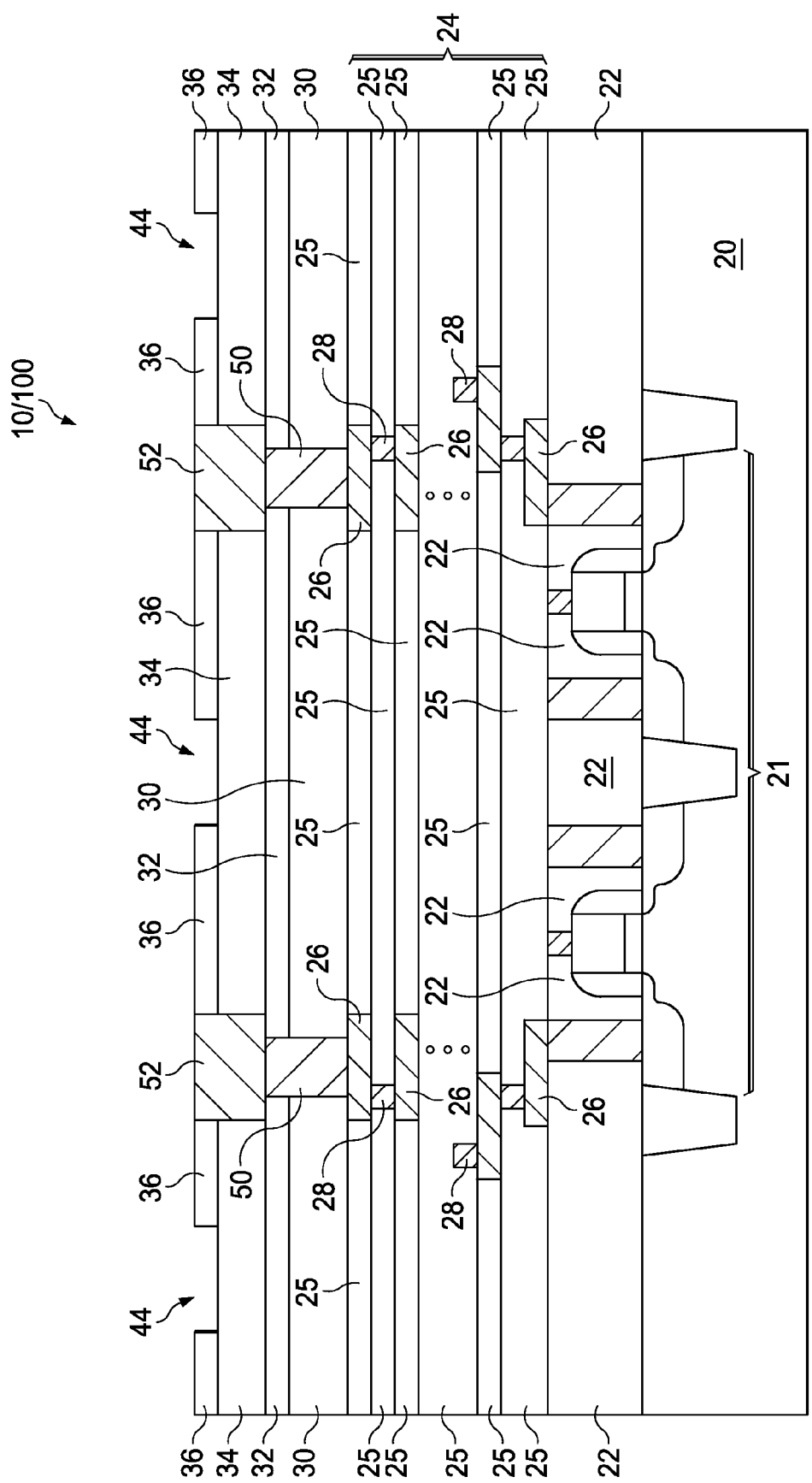
Figure 10:
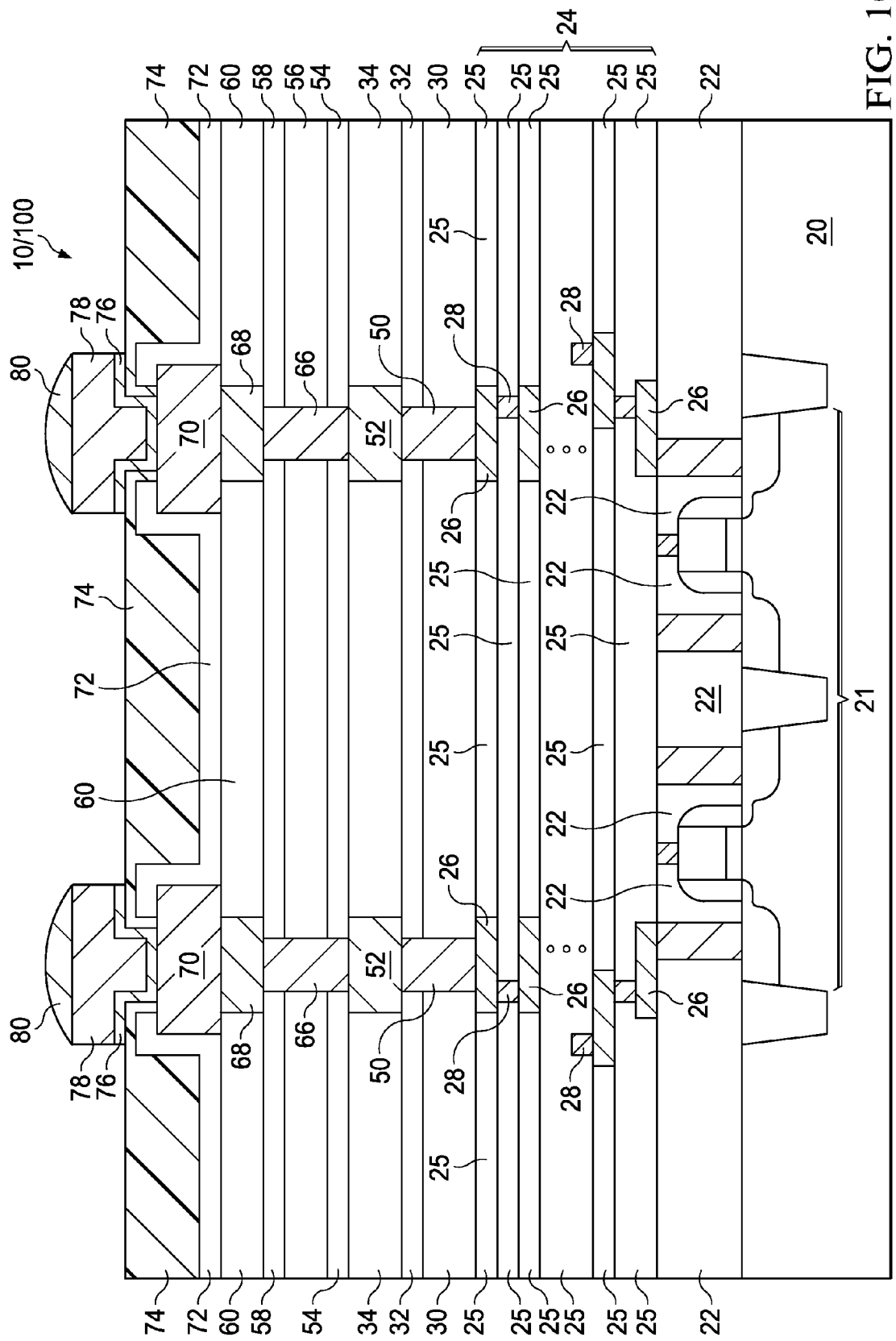
FIG. 10 illustrates the cross-sectional view of a wafer in accordance with alternative embodiments, wherein the stress tuning layers are removed from the wafer.

Next, as shown in FIG. 6, metal lines 52 and vias 50 are formed in trenches 48 and via openings 46, respectively. The formation may include forming a barrier layer (such as titanium, titanium nitride, tantalum, tantalum nitride, or the like, not shown) in trenches 48 and via openings 46, filling a conductive material (such as copper) into the remaining portions of trenches 48 and via openings 46, and performing a planarization (for example, a Chemical Mechanical Polish (CMP)) to level the top surfaces of metal lines 52. In some embodiments, as shown in FIG. 6, stress tuning layer 36 is used as the CMP stop layer, and hence is left un-removed. The top surfaces of metal lines 52 are hence level with the top surface of stress tuning layer 36. In alternative embodiments, stress tuning layer 36 is also removed in the CMP, and hence the top surfaces of metal lines 52 are level with the top surface of dielectric layer 34, as shown in FIG. 10.

Figure 7:
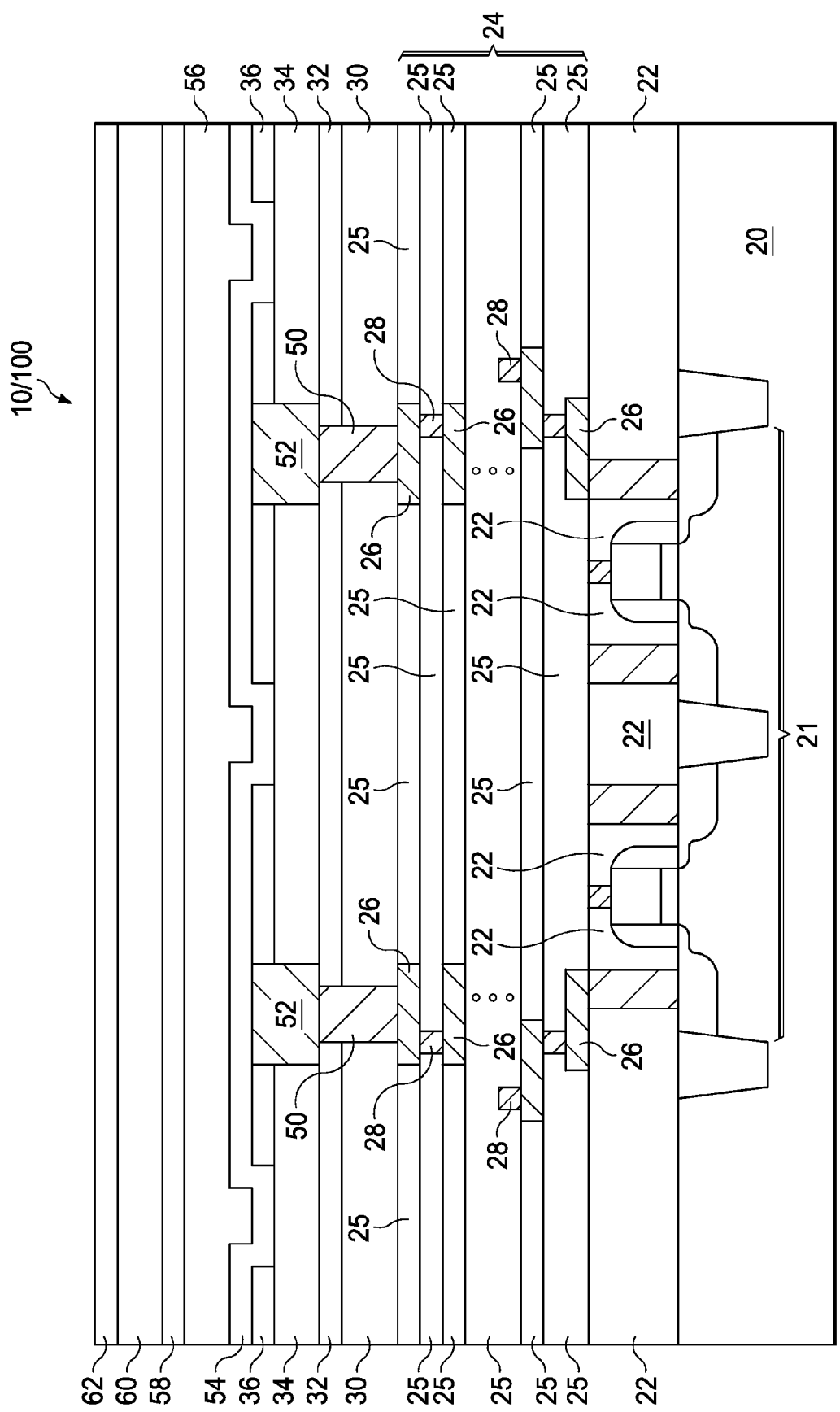

FIG. 7 illustrates the formation of etch stop layer 54 over dielectric layer 34 and stress tuning layer 36 (if left un-removed). Next, a plurality of layers are formed, including dielectric layer 56 over etch stop layer 54, etch stop layer 58 over dielectric layer 56, dielectric layer 60 over etch stop layer 58, and stress tuning layer 62 over dielectric layer 60. The materials and the formation methods of layers 56, 58, 60, and 62 may be similar to layers 30, 32, 34, and 36, respectively, and are not discussed in detail herein.

Figure 8:
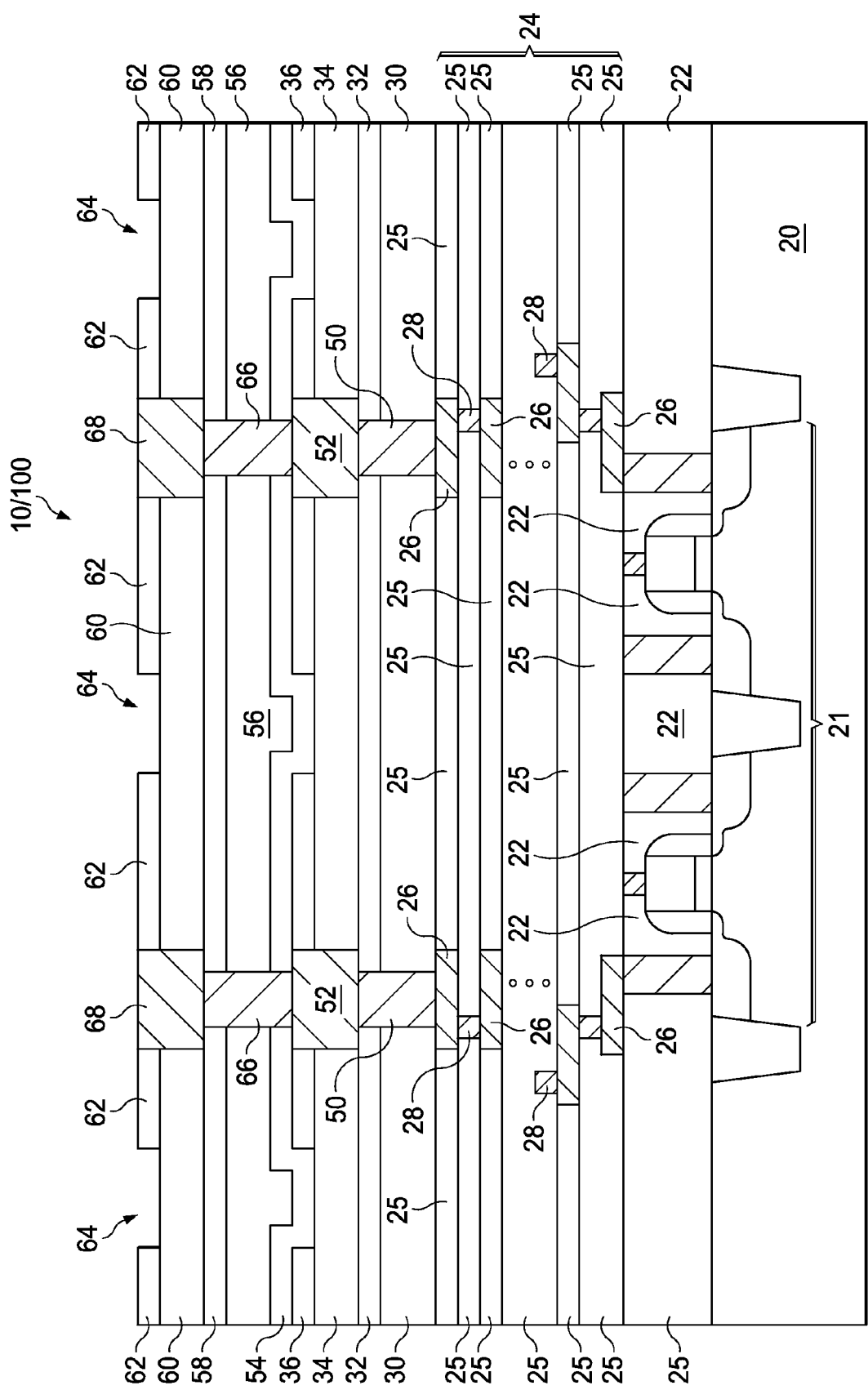

Next, as shown in FIG. 8, openings 64 are formed in stress tuning layer 62 in order to release the stress in wafer 100. In some embodiments, the positions and the patterns of openings 64 are the same as that of openings 44 (FIG. 4). In alternative embodiments, an additional measurement is performed. The additional measurement step may be performed after the step shown in FIG. 7 is finished, and before the step in FIG. 8 is started. In the additional measurement, the stress distribution and the warpage in wafer 100 is measured again, and the patterns of the stress tuning structures 200 (FIG. 23) are calculated again. In these embodiments, stress tuning structure 200 corresponds to openings 64 in FIG. 8. In these embodiments, the positions and the patterns of openings 64 may be different from that of openings 44 (FIG. 4). After the etching of stress tuning layer 62 to form openings 64, an annealing may be performed to transfer the stress in stress tuning layer 62 into the underlying layers. After the formation of stress tuning layer 62, metal lines 68 and vias 66 are formed, and are electrically connected to metal lines 52.

Figure 9:
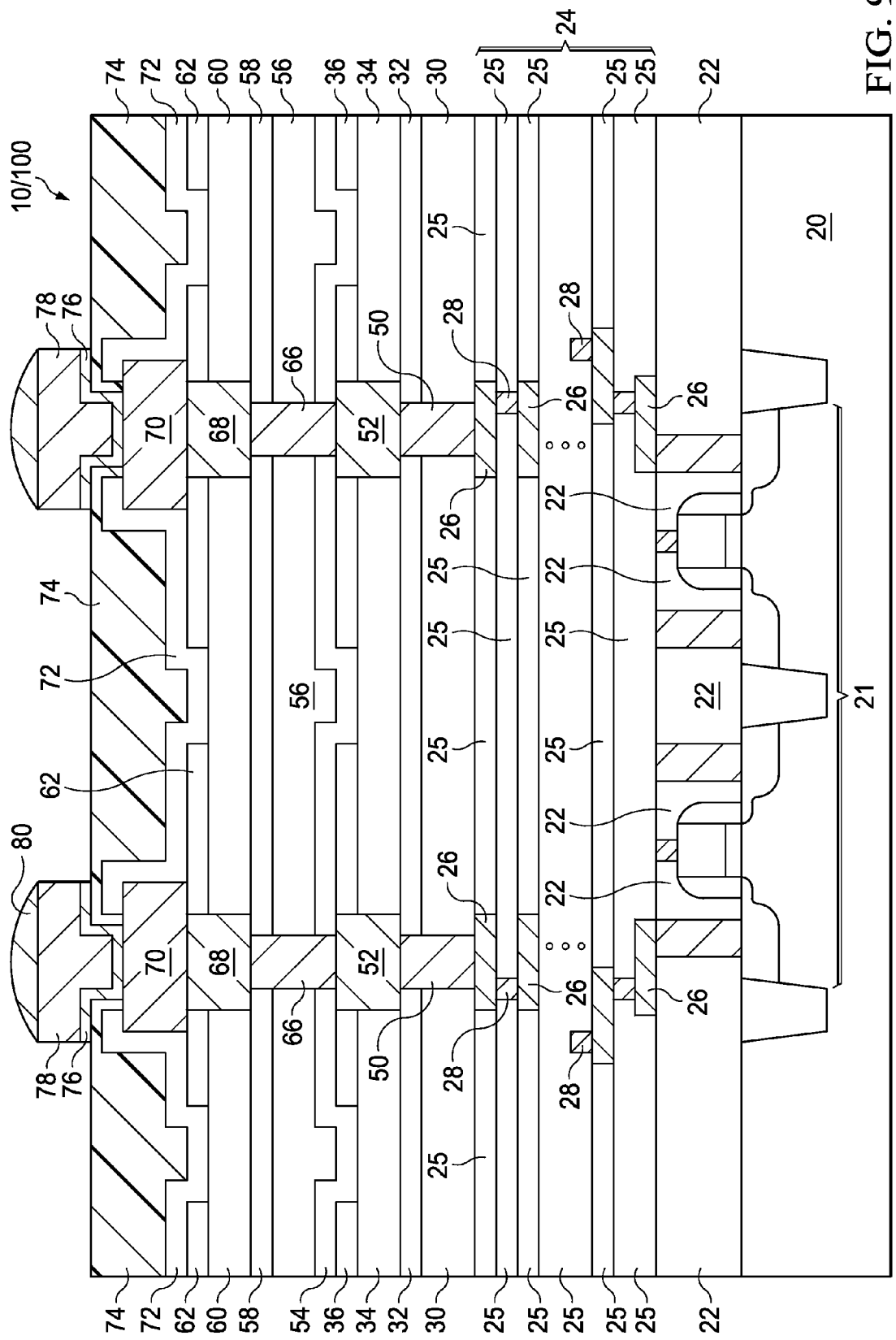

FIG. 9 illustrates the formation of the remaining portions of wafer 100 in accordance with some exemplary embodiments. In some embodiments, metal pads 70 are formed over and electrically coupled to metal lines 68. Metal pads 70 may be aluminum-comprising pads, for example, comprising aluminum copper (AlCu). Passivation layer 72 is formed to cover some portions of metal pads 70, and leaving some other portions of metal pads 70 not covered. In some embodiments, passivation layer 72 includes a silicon oxide layer (not shown) and a silicon nitride layer (not shown) over the silicon oxide layer, although passivation layer 72 may include other structures. Polymer layer 74, which may comprise polyimide, for example, may be formed over passivation layer 72. Under-Bump Metallurgies (UBMs) 76, which may include a copper layer over a titanium layer, is formed over polymer layer 74. UBMs 76 may extend into the openings in polymer layer 74 to contact metal pads 70. Copper pillars 78 and solder layers 80 may be formed over UBMs 76 in some embodiments.

In FIG. 9, stress tuning layer 36 may be formed over USG layer 34, with openings 44 (FIG. 4) formed in stress tuning layer 36. The dielectric layer (such as etch stop layer 54) that is overlying stress tuning layer 36 extends into openings 44, and hence penetrates through stress tuning layer 36 to contact the dielectric layer (such as dielectric layer 34) underlying stress tuning layer 36. Openings 44 (FIG. 4) are misaligned to metal lines 52 in FIG. 9. Stress tuning layer 62 may have the similar characteristics as stress tuning layer 36.

FIG. 10 illustrates wafer 100 in accordance with alternative embodiments. These embodiments are similar to the embodiments in FIG. 9, except that stress tuning layers 36 and 62 are removed in the CMP steps for forming metal lines 52 and 68, respectively.

FIGS. 11 through 17 illustrate the cross-sectional views of intermediate stages in the formation of a wafer in accordance with alternative embodiments. Unless specified otherwise, the materials and formation methods of the components in these embodiments are essentially the same as the like components, which are denoted by like reference numerals in the embodiments shown in FIGS. 1 through 9. The details regarding the formation process and the materials of the components shown in FIGS. 11 through 17 (and in FIGS. 18 through 22) may thus be found in the discussion of the embodiments shown in FIGS. 1 through 9.

Figure 11:
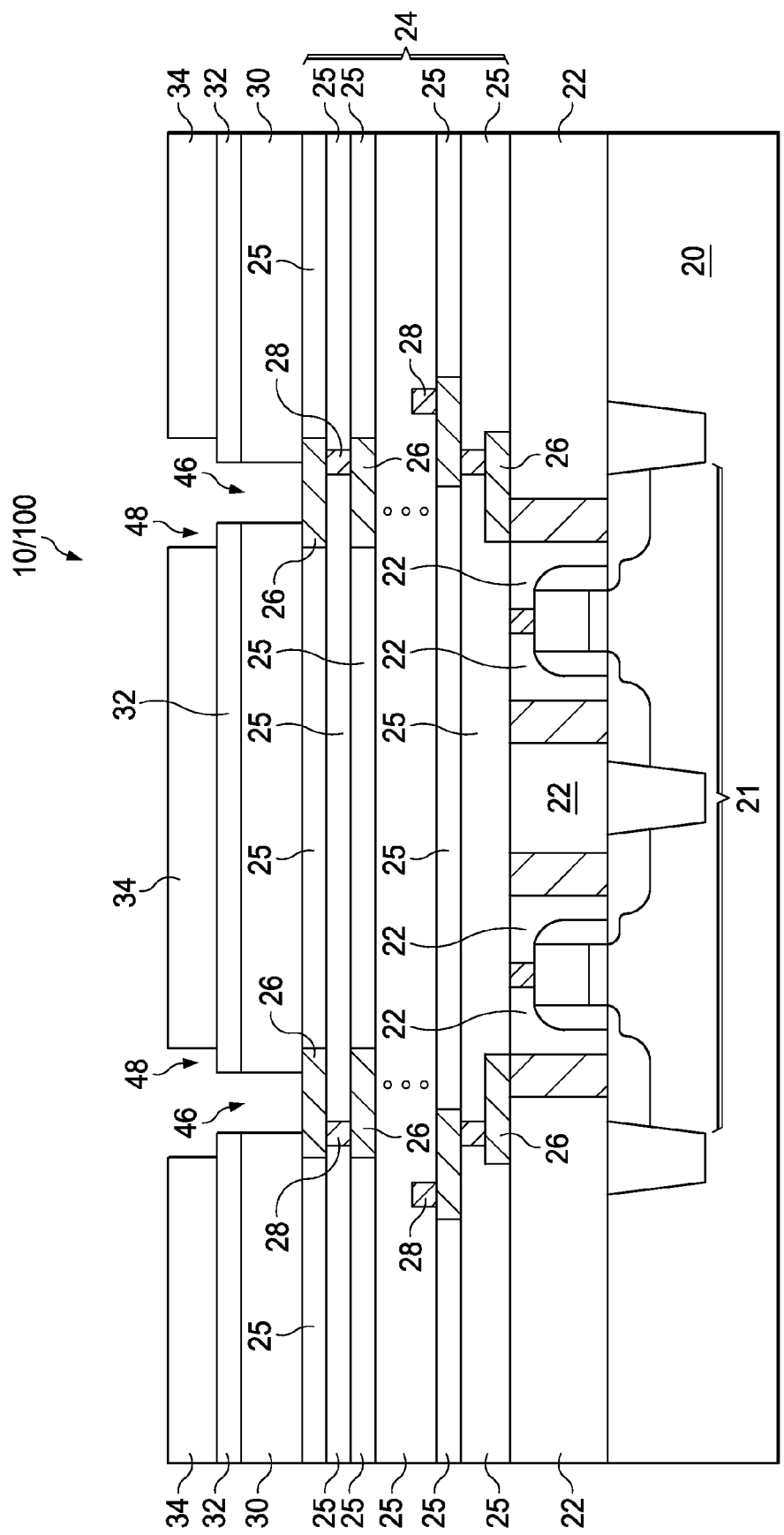
FIGS. 11 through 17 are cross-sectional views of intermediate stages in the manufacturing of a wafer in accordance with alternative embodiments, wherein low-stress dielectric regions are formed in the wafer.
Figure 12:
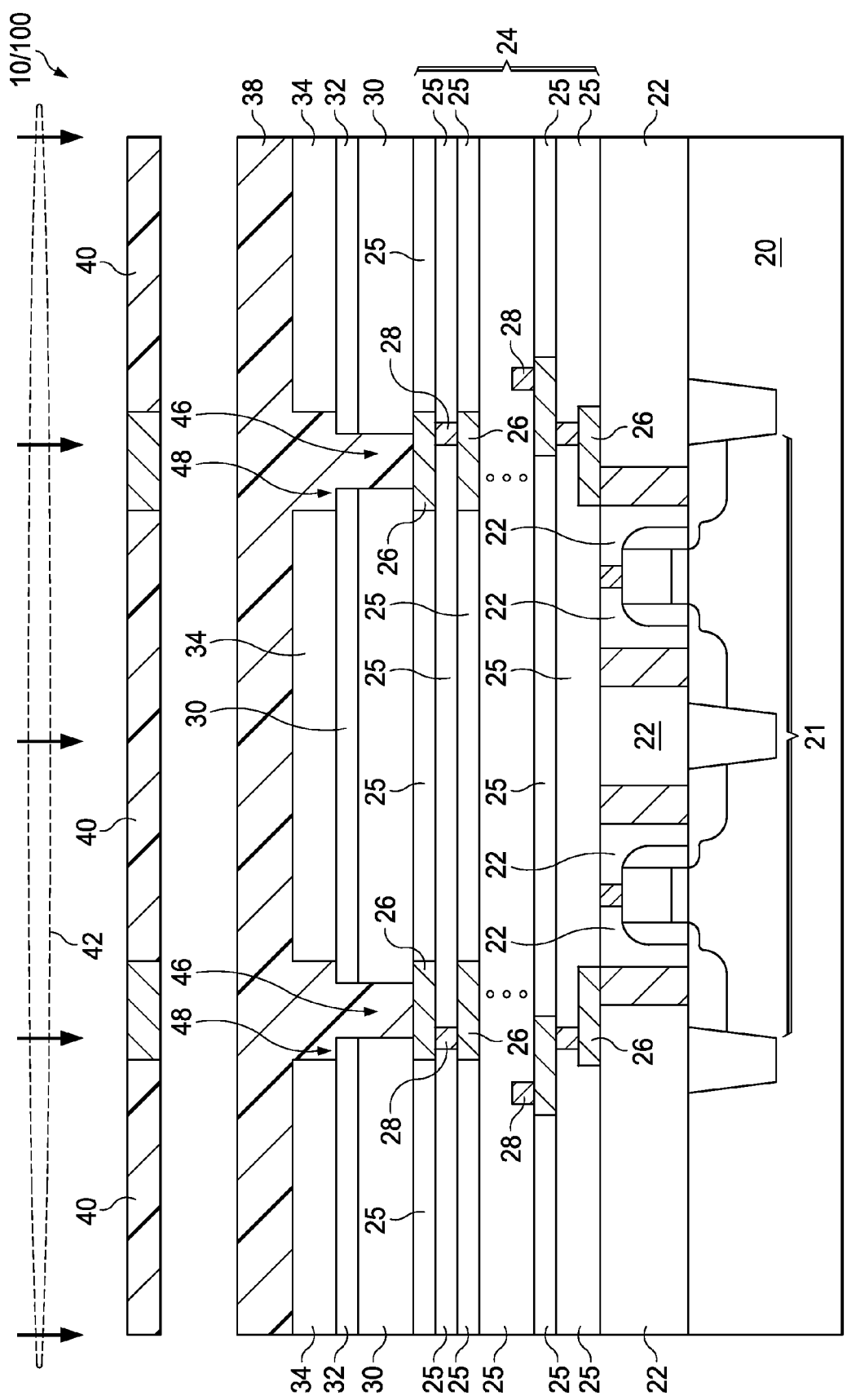

The initial steps of these embodiments are shown in FIG. 11, which is similar to the structure shown in FIG. 2, except that no stress tuning layer is formed over dielectric layer 34. Trenches 48 and via openings 46 are formed in dielectric layers 34 and 30, respectively, which step is essentially the same as in FIG. 5. Referring to FIG. 12, photo resist 38 is formed. Photo resist 38 includes some portions filling in trenches 48 and via openings 46, and portions over dielectric layer 34. Next, Photo resist 38 is exposed by light 42, with lithography mask 40 being used in the light exposure.

Figure 13:
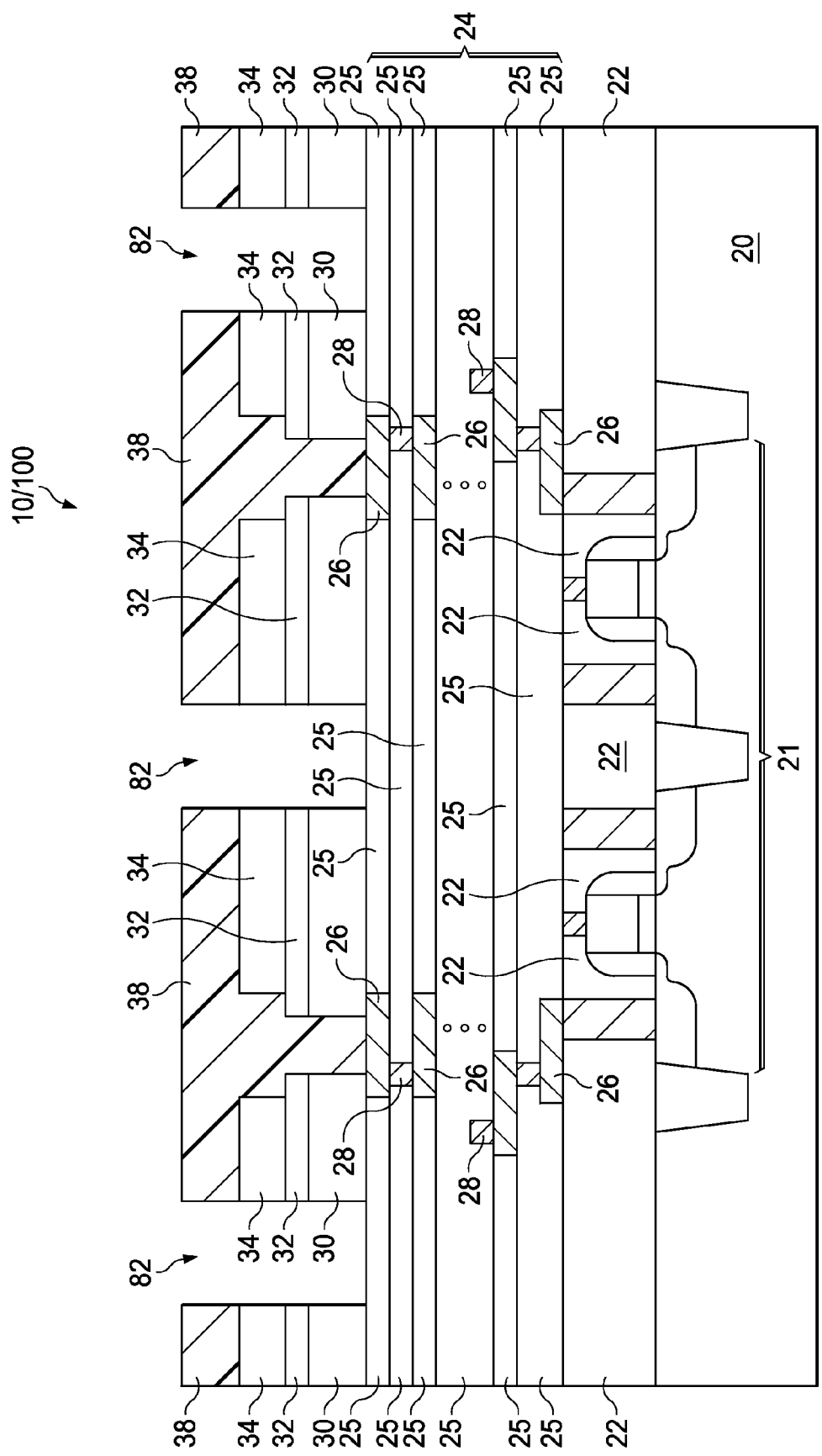

Referring to FIG. 13, dielectric layers 34, 32, and 30 are etched using the patterned photo resist 38 as an etching mask, followed by the removal of photo resist 38. Openings 82 are hence formed in dielectric layers 34, 32, and 30. The etching is stopped on a top one of dielectric layers 25 (which may be an etch stop layer) that is under dielectric layer 30. Photo resist 38 is then removed. The patterns (such as the sizes, the shapes, the locations, etc) of openings 82 are determined by measuring the stress distribution and the warpage of the structure showing in FIG. 11, and performing a calculation using the results obtained in the measurement. Accordingly, the patterns and the positions of openings 82 are determined, and correspond to the patterns and the positions of stress tuning structures 200 in FIG. 23. Since the portions of openings 82 in dielectric layers 30, 32, and 34 are formed in a same etching process, the sidewalls of openings 82 may be substantially straight, and openings 82 continuously extend through dielectric layers 30, 32, and 34.

Figure 14:
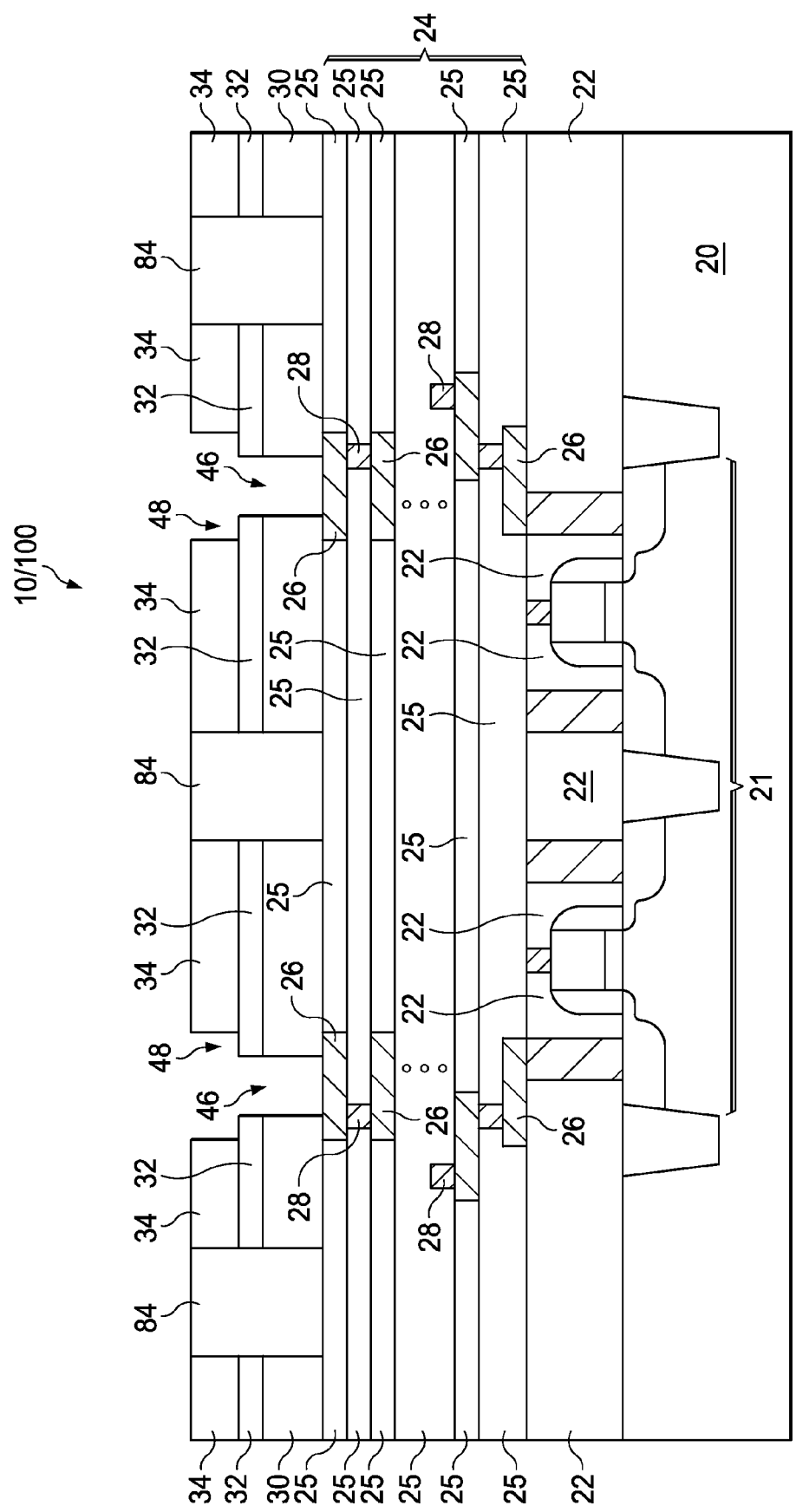
Figure 15:
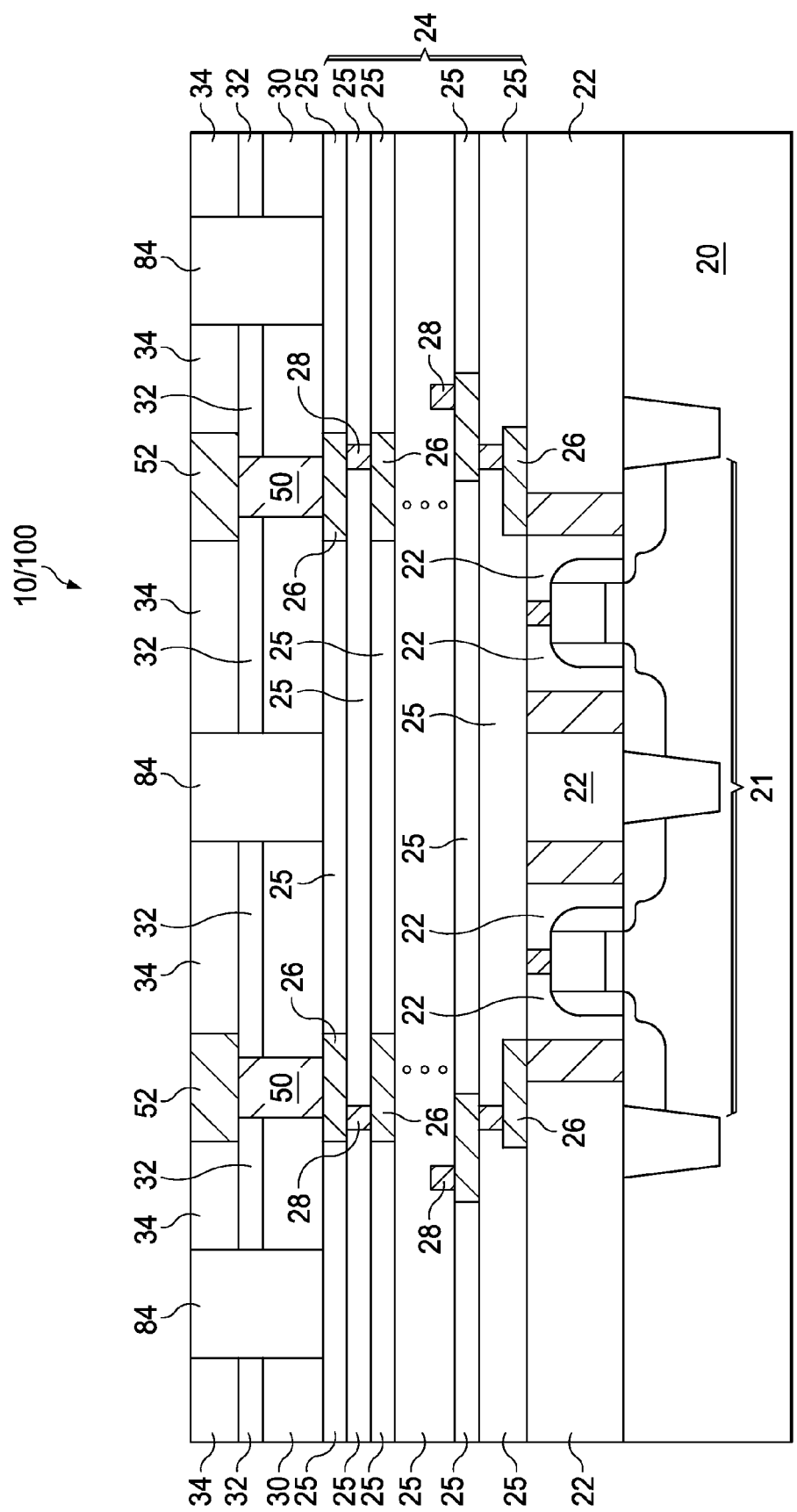

FIG. 14 illustrates the filling of openings 82 (FIG. 13) with a low-stress dielectric material, forming low-stress dielectric regions 84. Low-stress dielectric regions 84 hence continuously extend from the bottom surface of dielectric layer 30 to the top surface of dielectric layer 34, with no interface formed therein. The top surface and the bottom surface of low-stress dielectric regions 84 may be level with the top surface of dielectric layer 34 and the bottom surface of dielectric layer 30, respectively. Throughout the description, the low-stress dielectric material refers to the material that, when filled into openings 82, incurs a low stress or substantially no stress on the surrounding dielectric layers such as layers 30, 32, and 34. Hence, through the formation of openings 82 (FIG. 13) and the filling of low-stress dielectric regions 84, the stress in dielectric layers 34, 32, and 30 is released. The stress in wafer 100 is hence reduced, and the warpage of wafer 100 may be reduced. Metal lines 52 and vias 50 are then formed in trenches 48 and via openings 46, respectively, as shown in FIG. 15.

Figure 16:
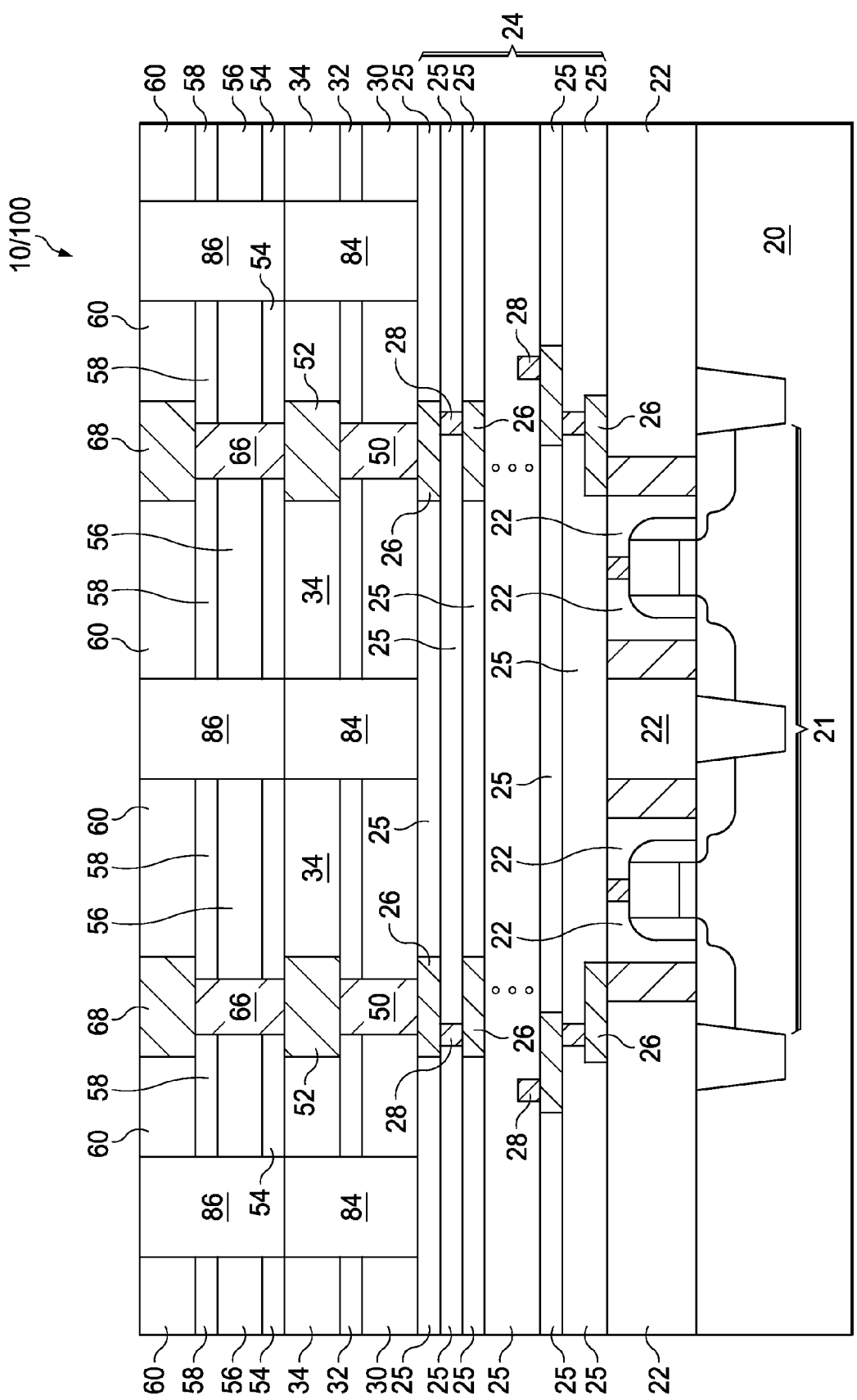

Next, as shown in FIG. 16, the process steps in FIGS. 11 through 15 are repeated to form dielectric layers 56, 58, 60, low-stress dielectric regions 86, metal lines 68, and vias 66. The details of the corresponding process steps are essentially the same as the formation of like elements in FIGS. 11 through 15, and hence are not repeated herein.

Figure 17:
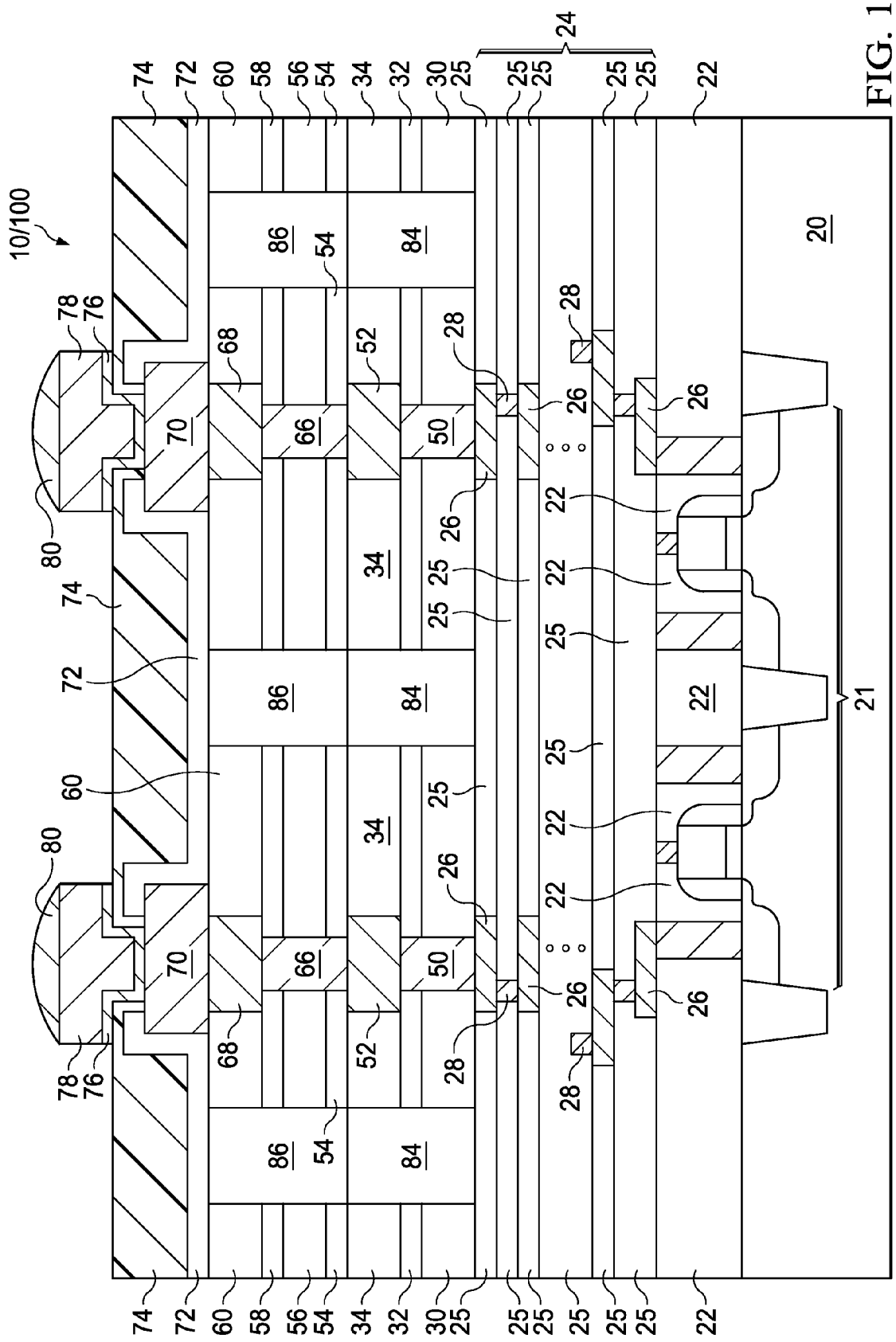

In these embodiments, low-stress dielectric regions 84 and 86 are the stress tuning structure 200 in FIG. 23, and may have the similar patterns as stress tuning structure 200. FIG. 17 also illustrates the formation of the components overlying dielectric layer 60 and metal lines 68, wherein the details of the illustrated components are the same as in the embodiments shown in FIG. 9.

In the embodiments in FIG. 17, low-stress dielectric regions 84 and 86 are formed of either a material different from the materials of dielectric layers 30, 32, 34, 56, 58, and 60, or a material same as the material of one or more of dielectric layers 30, 32, 34, 56, 58, and 60. In these embodiments, however, the characteristics (such as the densities) of low-stress dielectric regions 84 and 86 are different from that of dielectric layers 30, 32, 34, 56, 58, and 60. Low-stress dielectric regions 84 and 86 may be dielectric plugs (which correspond to stress tuning islands 200B in FIG. 23) or dielectric rings (which correspond to stress tuning rings 200A in FIG. 23). Each of stacked group of dielectric regions 84 and 86 may not be in contact with any metallic feature.

Figure 18:
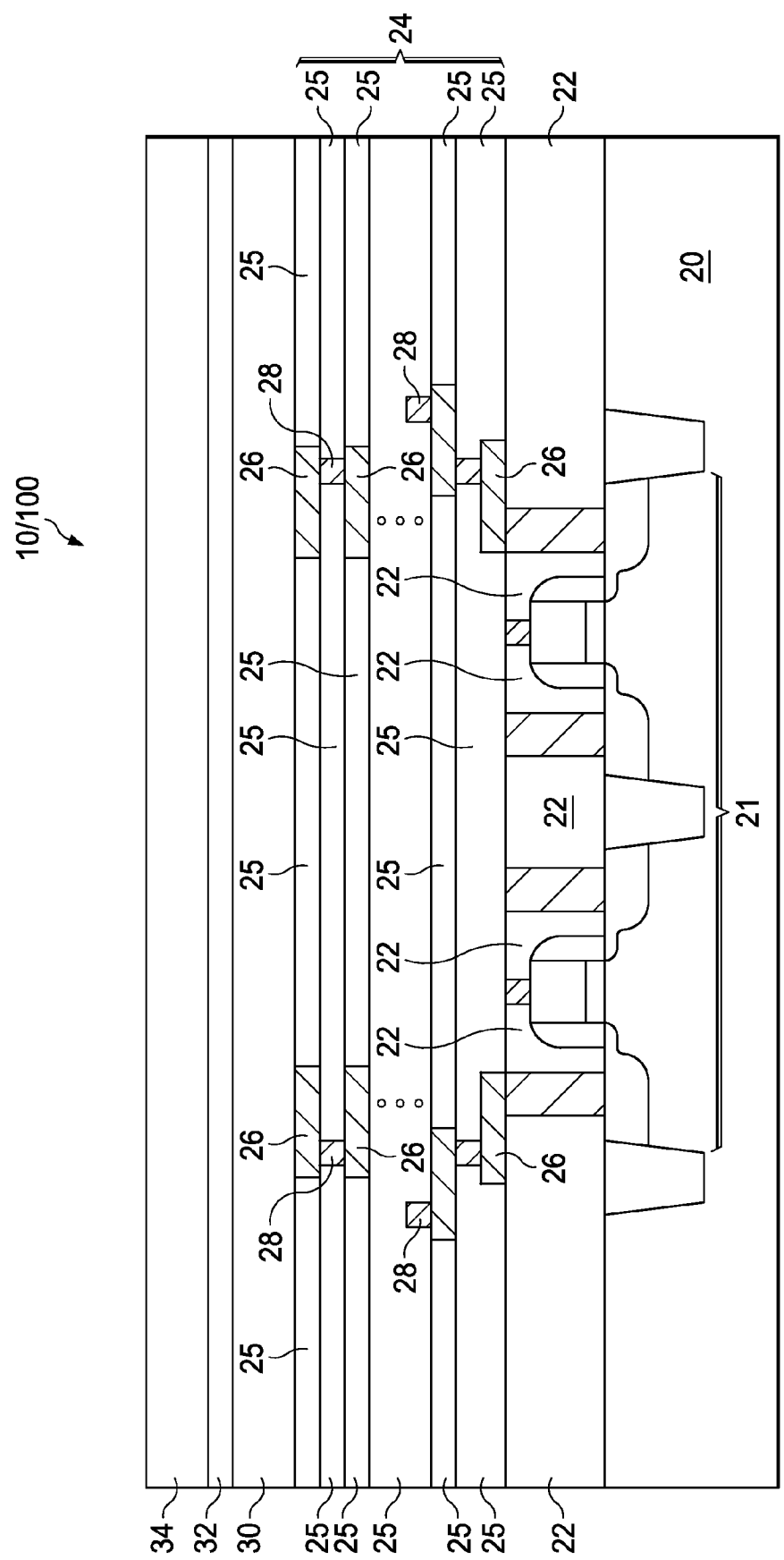
FIGS. 18 through 22 are cross-sectional views of intermediate stages in the manufacturing of a wafer in accordance with yet alternative embodiments, wherein low-stress metal regions are formed in the wafer.

FIG. 18 through 22 illustrate the formation of the stress tuning structures in accordance with yet alternative embodiments, in which the stress tuning regions are metal regions. Referring to FIG. 18, an initial structure is formed, with dielectric layers 30, 32, and 34 formed as the top dielectric layers. A measurement may be performed to measure the stress distribution and the warpage of wafer 100. A calculation is made using the results obtained in the measurement step to calculate the desirable patterns of the stress tuning regions.

Figure 19:
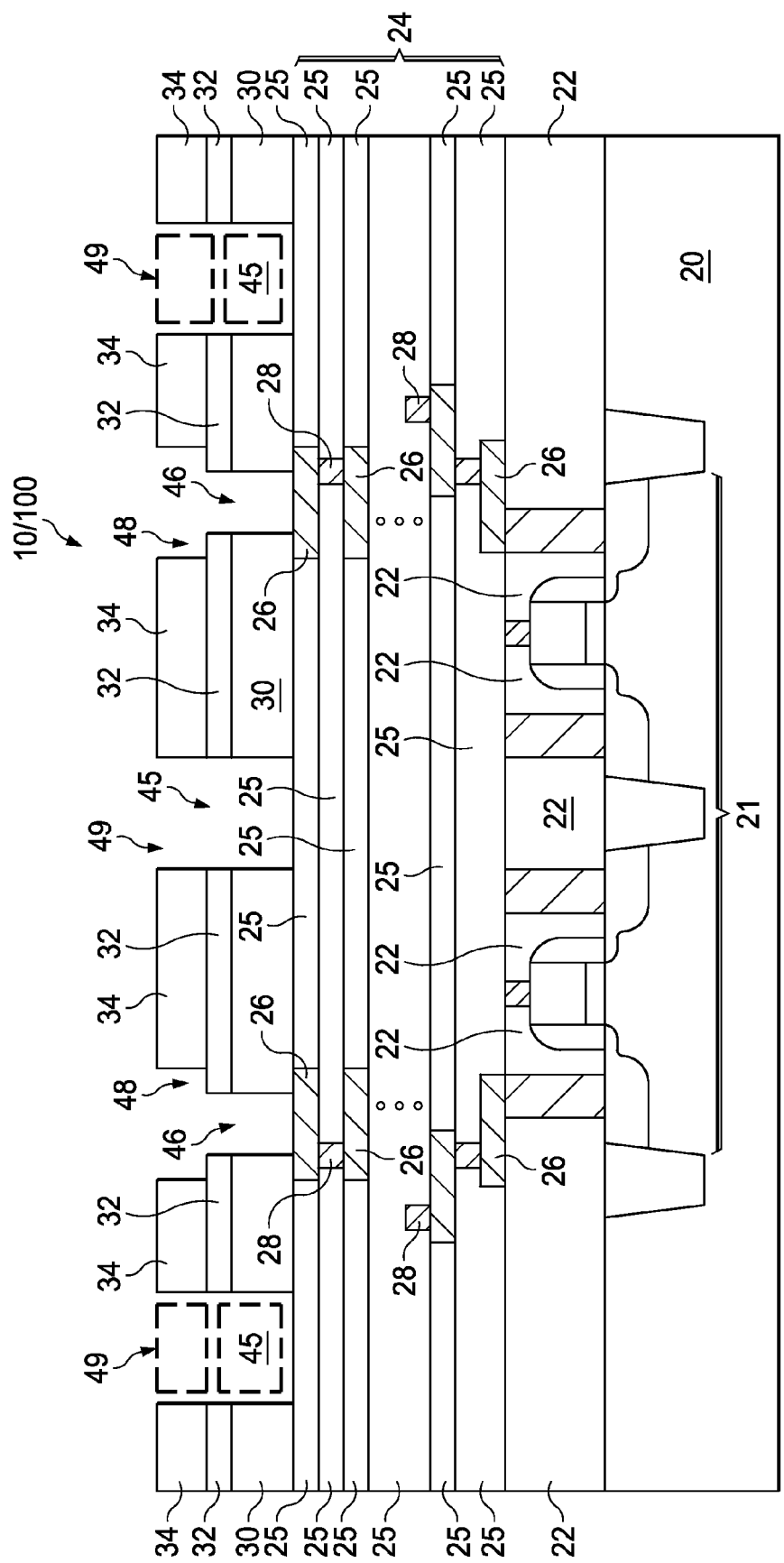

Next, as shown in FIG. 19, a trench formation process and a via formation process are performed to form trenches 48 and via openings 46. At the same time trenches 48 are formed, openings 49 are formed in dielectric layer 34. At the same time via openings 46 are formed, openings 45 are also formed in dielectric layer 30. Hence, the formation of openings 49 may share a same lithography process and a same lithography mask as trenches 48, and the formation of openings 45 may share a same lithography process and a same lithography mask as via openings 46. Accordingly, no extra manufacturing cost is involved in the formation of openings 45 and 49. The patterns of openings 49 and 45 are calculated using the measurement results, which measurement is performed on the structure showing in FIG. 18. Accordingly, the patterns of openings 49 and 45 correspond to the patterns of stress tuning structures 200 in FIG. 23.

Figure 20:
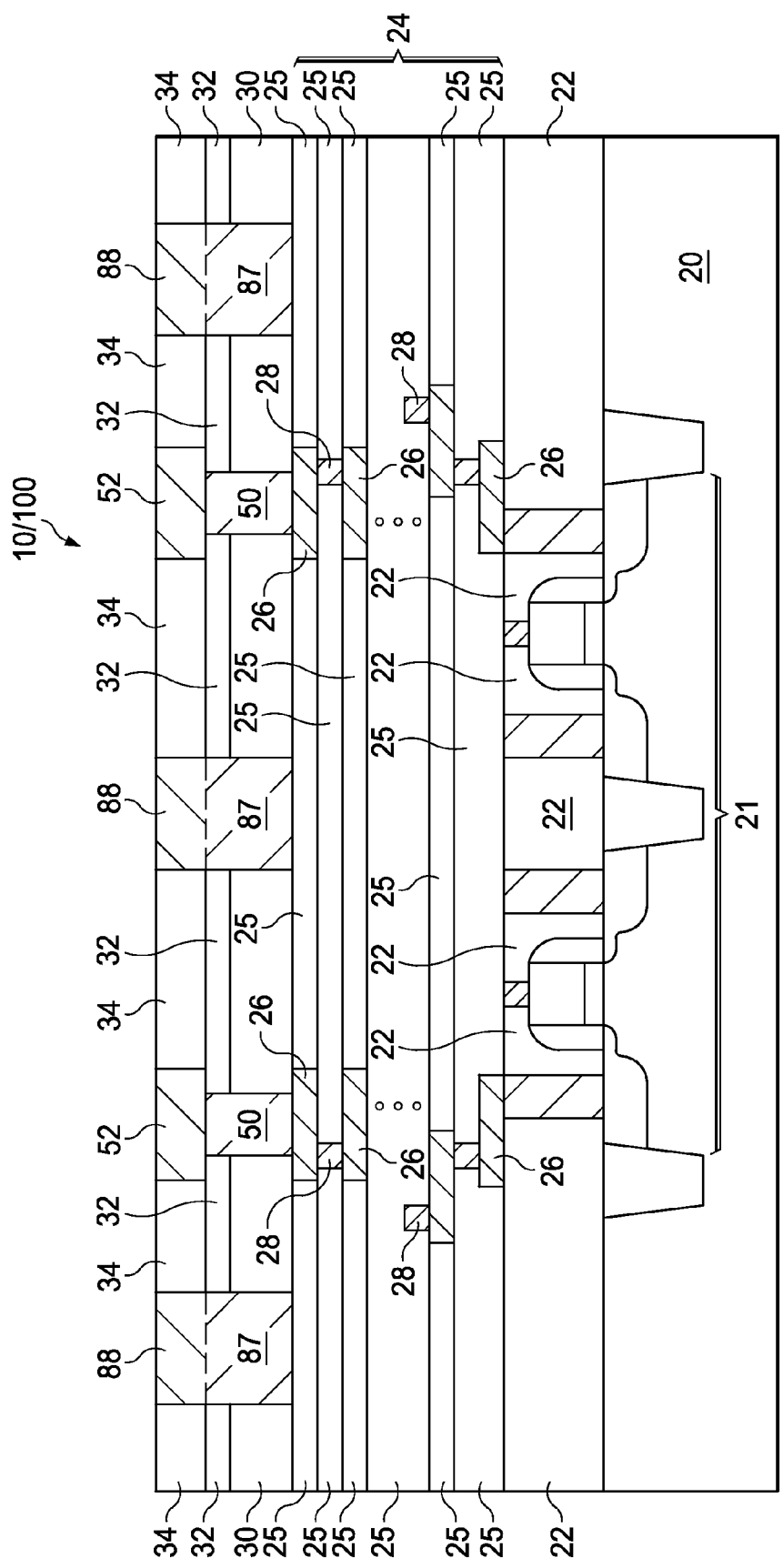

Referring to FIG. 20, a metal filling step is performed to fill trenches 48 and via openings 46 with conductive materials, and hence metal lines 52 and vias 50, respectively, are formed. At the same time metal lines 68 and vias 66 are formed, metal features 87 and 88 are formed in openings 49 and 45, respectively. Metal features 87 and the respective overlying metal features 88 are portions of the same continuous metal features, with no interface formed between metal features 87 and 88. The top surfaces the bottom surfaces of metal features 88 are level with the top surface and the bottom surfaces, respectively, of metal lines 52, and the bottom surfaces of metal features 87 are level with the top surface and the bottom surfaces, respectively, of vias 50.

Figure 21:
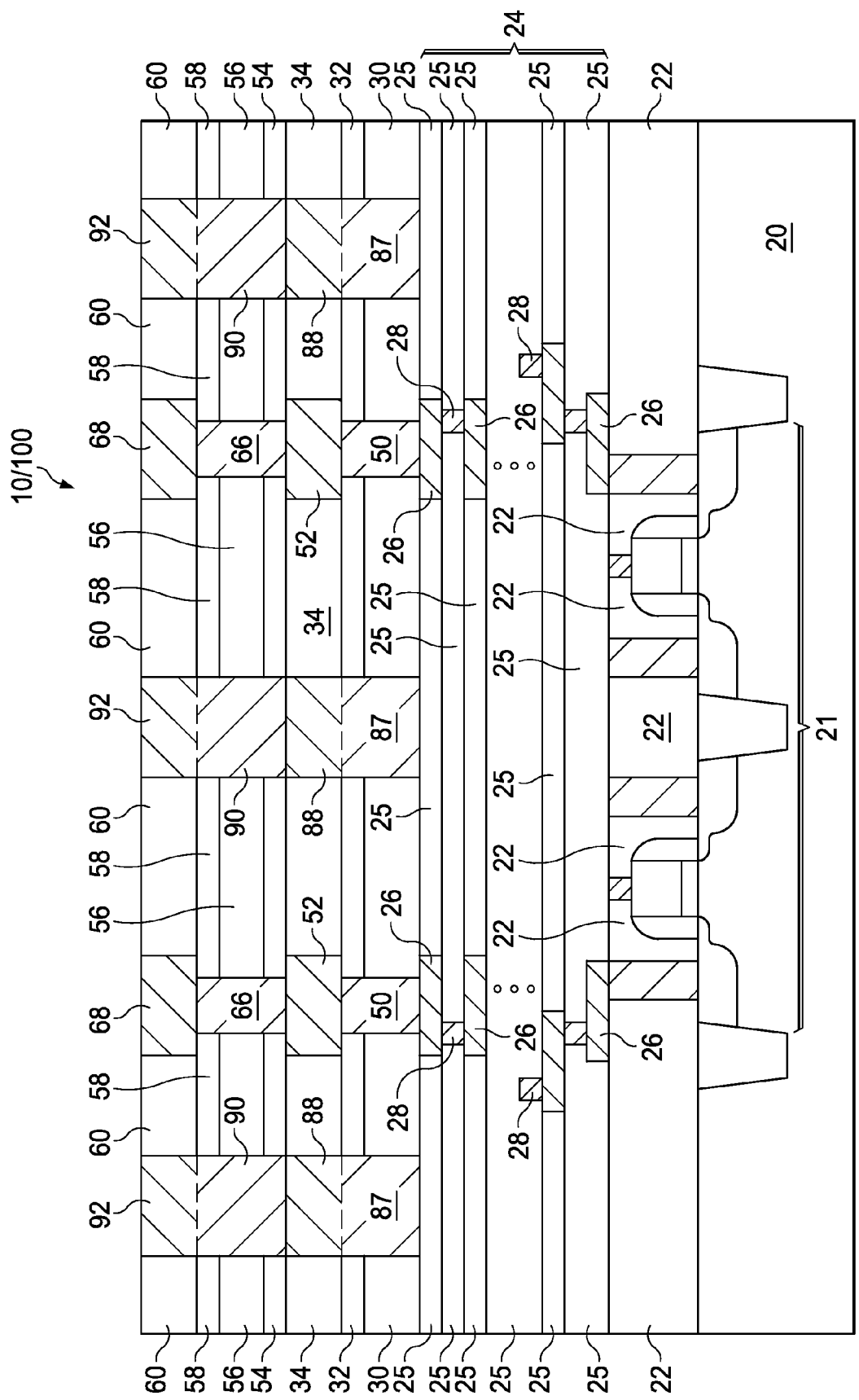

Next, as shown in FIG. 21, the process steps in FIGS. 18 through 20 are repeated to form dielectric layers 56, 58, and 60, metal features 92 and 90, and vias 66. The details of the process steps are essentially the same as the formation of like elements in FIGS. 17 through 20, and hence are not repeated herein.

Figure 22:
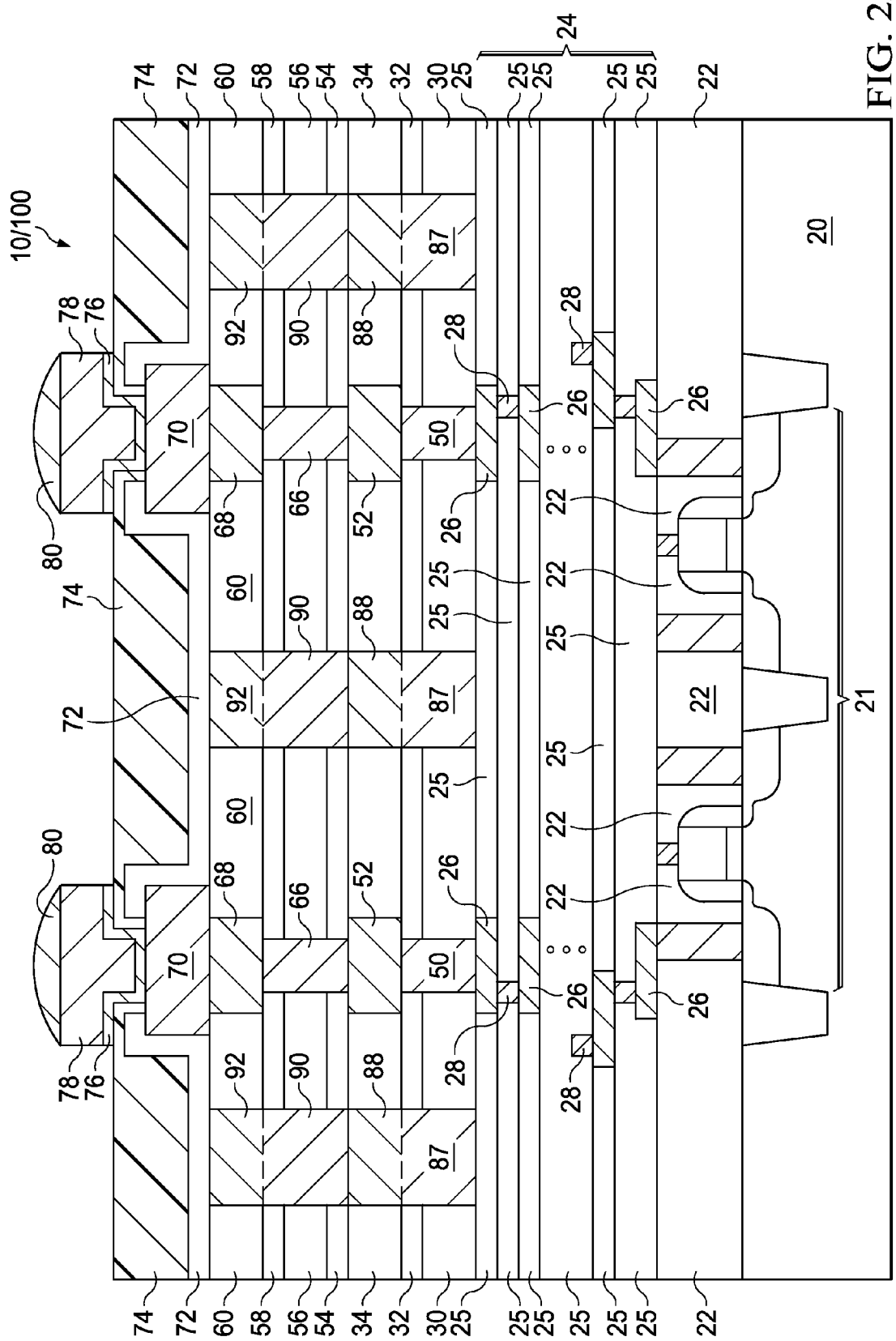

As shown in FIG. 21, metal features 87, 88, 90, and 92 act as the stress tuning structure 200 in FIG. 23, and may have patterns similar to the patterns of the stress tuning structure 200. Metal features 87, 88, 90, and 92 have smaller stresses than dielectric layers such as layers 30, 32, 34, 56, 58, and 60, and hence their formation may help release the stress in wafer 100. Metal features 87, 88, 90, and 92 may be electrically floating. Each group of stacked metal features 87, 88, 90, and 92 may be enclosed by, and in contact with, dielectric materials. Furthermore, each group of stacked metal features 87, 88, 90, and 92 may not be in contact with any other metallic features. By forming metal features 87, 88, 90, and 92, the internal stress of wafer 100 is at least reduced, or substantially eliminated. FIG. 22 illustrates the formation of the components overlying dielectric layer 62, wherein the details of the components are the same as in the embodiments shown in FIG. 9.

In the embodiments of the present disclosure, stress tuning layers/regions are formed to release stresses in wafers, which stress tuning layers/regions may be between the metal pads (and passivation layers) and low-k (or extreme low-k) dielectric layers. The stresses in the wafers are thus reduced, and the wafer warpage is reduced. Hence, in the subsequent bonding of the wafers (or the chips in the wafers), since the wafers/chips have smaller warpage, the mis-bonding caused by the wafer warpage is reduced.

In accordance with some embodiments, an integrated circuit structure includes a substrate, a plurality of low-k dielectric layers over the substrate, a first dielectric layer over the plurality of low-k dielectric layers, and a metal line in the first dielectric layer. A stress tuning dielectric layer is over the first dielectric layer, wherein the stress tuning dielectric layer includes a first opening and a second opening. The metal line extends into the first opening. The second opening has a bottom substantially level with a top surface of the first dielectric layer. A second dielectric layer is over the first dielectric layer.

In accordance with other embodiments, an integrated circuit structure includes a substrate, a plurality of low-k dielectric layers over the substrate, a first dielectric layer over the plurality of low-k dielectric layers a via in the first dielectric layer, and a second dielectric layer over the first dielectric layer. A metal line is in the second dielectric layer and forming an integrated metal feature with the via. A stress tuning dielectric region continuously extends from a top surface of the second dielectric layer to a bottom surface of the first dielectric layer, wherein the stress tuning dielectric region includes a dielectric material or a metal feature that is electrically floating.

In accordance with yet other embodiments, a method includes forming a plurality of low-k dielectric layers over a substrate, forming a first dielectric layer over the plurality of low-k dielectric layers, and forming a second dielectric layer over the first dielectric layer. A stress tuning dielectric layer is formed over the second dielectric layer. An opening is formed in the stress tuning dielectric layer, wherein a top surface of the second dielectric layer exposed through the opening. The stress tuning dielectric layer and the second dielectric layer are etched to form a trench, wherein the step of forming the opening and the etching the stress tuning dielectric layer are separate etching steps. The first dielectric layer is etched to form a via opening connected to the trench. The trench and the via opening are filled to form a metal line and a via, respectively.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
    a substrate;
    a plurality of low-k dielectric layers over the substrate;
    a first dielectric layer over the plurality of low-k dielectric layers;
    a metal line in the first dielectric layer;
    a stress tuning dielectric layer over the first dielectric layer, wherein the stress tuning dielectric layer comprises:
        a first opening, wherein the metal line extends into the first opening; and
        a second opening with a bottom substantially level with a top surface of the first dielectric layer; and
    a second dielectric layer over the first dielectric layer.

2. The integrated circuit structure of claim 1, wherein the first dielectric layer comprises un-doped silicate glass.

3. The integrated circuit structure of claim 1, wherein the second dielectric layer extends into the second opening to contact the first dielectric layer.

4. The integrated circuit structure of claim 1, wherein the second opening is in a semiconductor chip, and wherein the second opening forms a ring comprising four sides, with each of the four sides adjacent to one of four edges of the semiconductor chip.

5. The integrated circuit structure of claim 4, wherein the stress tuning dielectric layer further comprises a plurality of openings isolated from each other and disconnected from any metallic feature, and wherein the second dielectric layer extends into the plurality of openings to contact the first dielectric layer.

6. The integrated circuit structure of claim 1 further comprising:
    an etch stop layer over the stress tuning dielectric layer, wherein the etch stop layer penetrates through the second opening to contact the first dielectric layer; and an un-doped silicate glass layer over and contacting the etch stop layer.

7. The integrated circuit structure of claim 1 further comprising:
a passivation layer over the stress tuning dielectric layer, wherein the passivation layer penetrates through the second opening to contact the first dielectric layer, and wherein the passivation layer comprises an oxide layer and a nitride layer over and contacting the oxide layer; and
an aluminum-containing pad over the stress tuning dielectric layer, wherein the aluminum-containing pad is electrically coupled to the metal line.

8. An integrated circuit structure comprising:
a substrate;
a plurality of low-k dielectric layers over the substrate;
a first dielectric layer over the plurality of low-k dielectric layers;
a via in the first dielectric layer;
a second dielectric layer over the first dielectric layer;
a metal line in the second dielectric layer and forming an integrated metal feature with the via; and
a stress tuning region continuously extending from a top surface of the second dielectric layer to a bottom surface of the first dielectric layer, wherein the stress tuning region comprises a dielectric material or a metal feature that is electrically floating.

9. The integrated circuit structure of claim 8, wherein the stress tuning region is formed of a dielectric material different from dielectric materials of the first dielectric layer and the second dielectric layer.

10. The integrated circuit structure of claim 8, wherein the stress tuning region is formed of a dielectric material with a lower inner stress than the first dielectric layer and the second dielectric layer.

11. The integrated circuit structure of claim 8, wherein the stress tuning region comprises a metal.

12. The integrated circuit structure of claim 8, wherein the stress tuning region comprises a straight edge continuously extends from the top surface of the second dielectric layer to the bottom surface of the first dielectric layer.

13. The integrated circuit structure of claim 8, wherein the first dielectric layer and the second dielectric layer comprise un-doped silicate glass.

14. The integrated circuit structure of claim 8, wherein the stress tuning region is in a semiconductor chip, and wherein the stress tuning region forms a ring adjacent to four edges of the semiconductor chip.

15. An integrated circuit structure comprising:
a substrate;
a first low-k dielectric layer over the substrate;
a dielectric stress tuning layer over the first low-k dielectric layer, wherein the dielectric stress tuning layer has an internal stress higher than about 4 MPa;
a metal line extending from a top surface of the dielectric stress tuning layer to a bottom surface of the first low-k dielectric layer; and
an etch stop layer comprising:
a first portion over and contacting the dielectric stress tuning layer and the metal line; and
a plurality of second portions penetrating through the dielectric stress tuning layer, wherein the plurality of second portions contacts a top surface of the first low-k dielectric layer.

16. The integrated circuit structure of claim 15, wherein the plurality of second portions of the etch stop layer comprises a plurality of discrete portions, each encircled by the dielectric stress tuning layer, and wherein the plurality of second portions is separated from each other by the dielectric stress tuning layer.

17. The integrated circuit structure of claim 15, wherein the plurality of second portions of the etch stop layer comprises a ring portion proximal edges of a respective chip that comprises the integrated circuit structure, with an entirety of an inner edge and an entirety of an outer edge of the ring portion contacting the dielectric stress tuning layer.

18. The integrated circuit structure of claim 15, wherein a top surface of the metal line is coplanar with a top surface of the dielectric stress tuning layer, and a bottom surface of the metal line is coplanar with a bottom surface of the first low-k dielectric layer.

19. The integrated circuit structure of claim 15, wherein lowest bottom surfaces of the etch stop layer are coplanar with a bottom surface of the dielectric stress tuning layer.

20. The integrated circuit structure of claim 15 further comprising a second low-k dielectric layer over and contacting the etch stop layer.

* * * * *